(12) United States Patent
Sekiya et al.

(10) Patent No.: US 7,366,422 B2
(45) Date of Patent: Apr. 29, 2008

(54) DISPERSION COMPENSATING DEVICE AND OPTICAL TRANSMISSION SYSTEM

(75) Inventors: Motoyoshi Sekiya, Kawasaki (JP); Yuuichi Kawahata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 618 days.

(21) Appl. No.: 11/085,419

(22) Filed: Mar. 22, 2005

(65) Prior Publication Data

US 2006/0098988 A1     May 11, 2006

(30) Foreign Application Priority Data

Nov. 10, 2004   (JP) .............................. 2004-326380

(51) Int. Cl.
*H04B 10/12*     (2006.01)

(52) U.S. Cl. .................... 398/147; 398/188; 398/192

(58) Field of Classification Search .................. 398/81, 398/147, 148, 188, 192–194
See application file for complete search history.

(56) References Cited

U.S. PATENT DOCUMENTS

| | | | |
|---|---|---|---|
| 6,370,300 B1 * | 4/2002 | Eggleton et al. ............ 385/37 |
| 6,782,017 B1 | 8/2004 | Kai et al. ............... 372/29.02 |
| 2003/0138007 A1 | 7/2003 | Lee et al. ..................... 372/32 |
| 2003/0185504 A1 * | 10/2003 | Yamauchi et al. ............ 385/27 |
| 2004/0027690 A1 * | 2/2004 | Takahashi .................. 359/726 |

FOREIGN PATENT DOCUMENTS

| | | |
|---|---|---|
| EP | 0 884 866 A1 | 12/1998 |
| JP | WO97/34379 | 9/1997 |
| JP | 11-223745 | 8/1999 |
| JP | 2000-323784 | 11/2000 |
| JP | 2003-218461 | 7/2003 |
| JP | 2003-294999 | 10/2003 |

* cited by examiner

*Primary Examiner*—Dzung Tran
(74) *Attorney, Agent, or Firm*—Staas & Halsey LLP

(57) ABSTRACT

A dispersion compensating device having a VIPA plate which is an optical component, a lens, and a mirror includes high reflectivity side monitor means for monitoring the light that is input into the VIPA plate and emitted from the first reflecting surface. By this, the passage characteristics of the dispersion compensating device (VIPA) can be equalized to the input light wavelength (output wavelength of light transmitter) in a highly stable manner while restraining the loss of main signal light to the minimum.

19 Claims, 17 Drawing Sheets

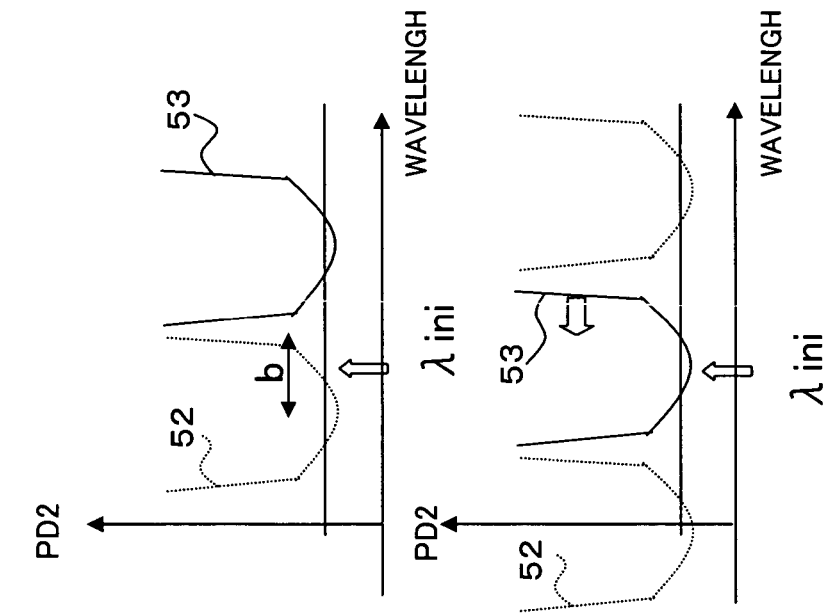
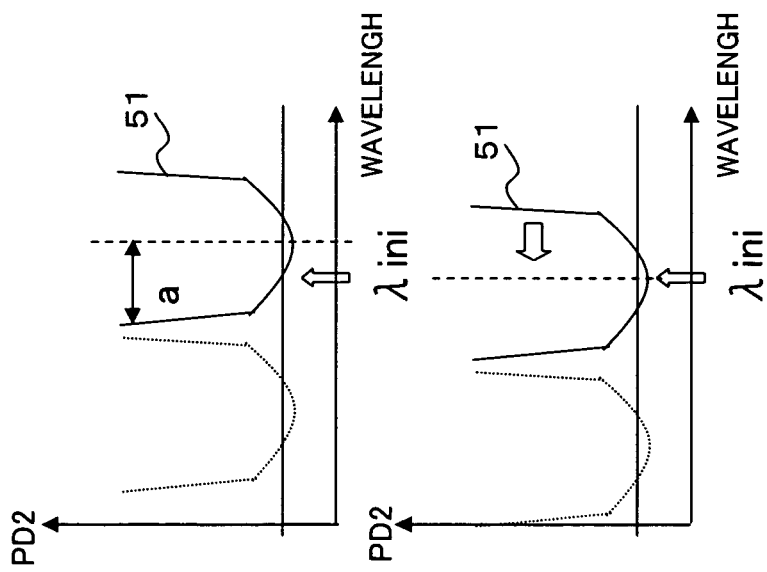
FIG. 6A
FIG. 6B
FIG. 5A
FIG. 5B

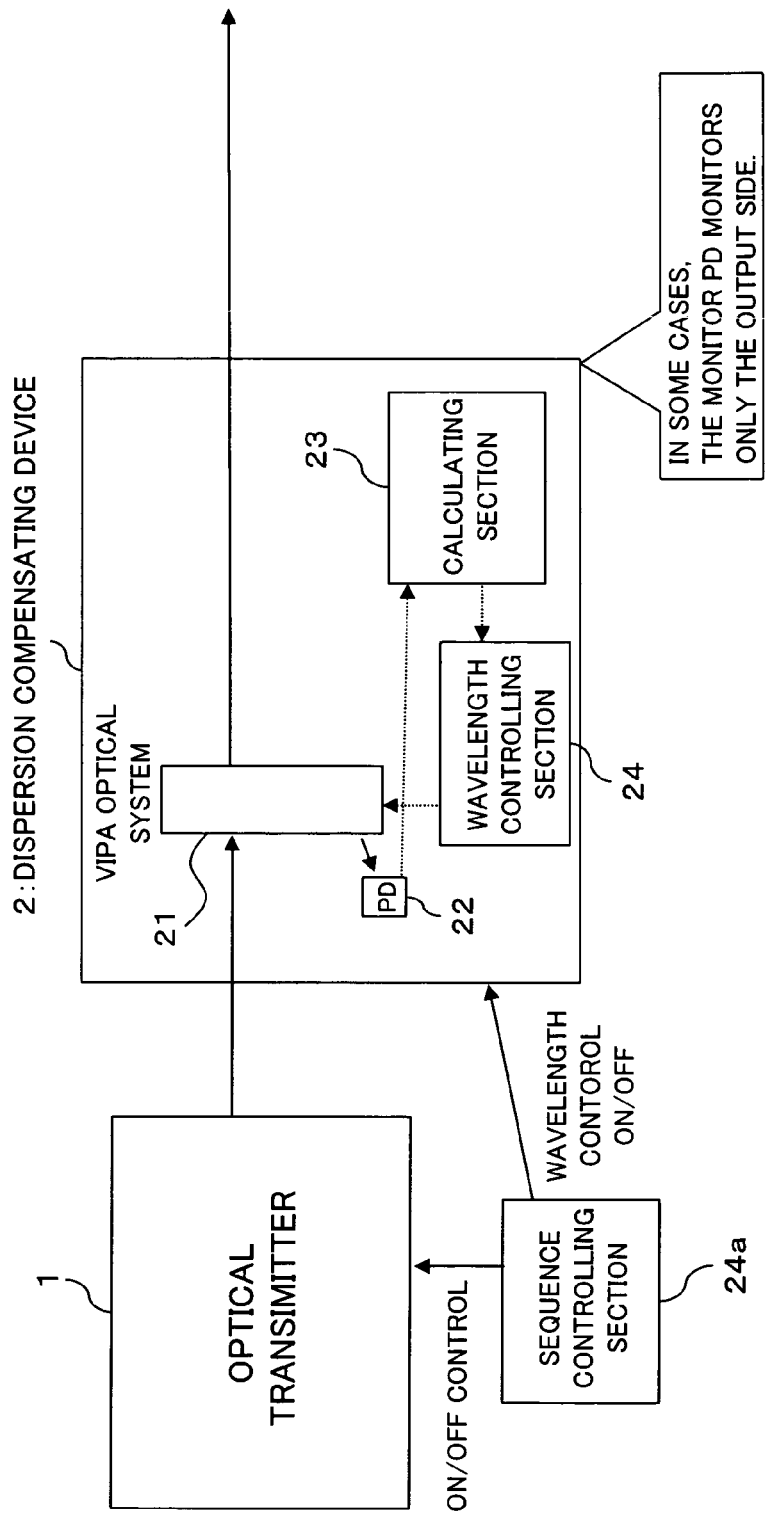

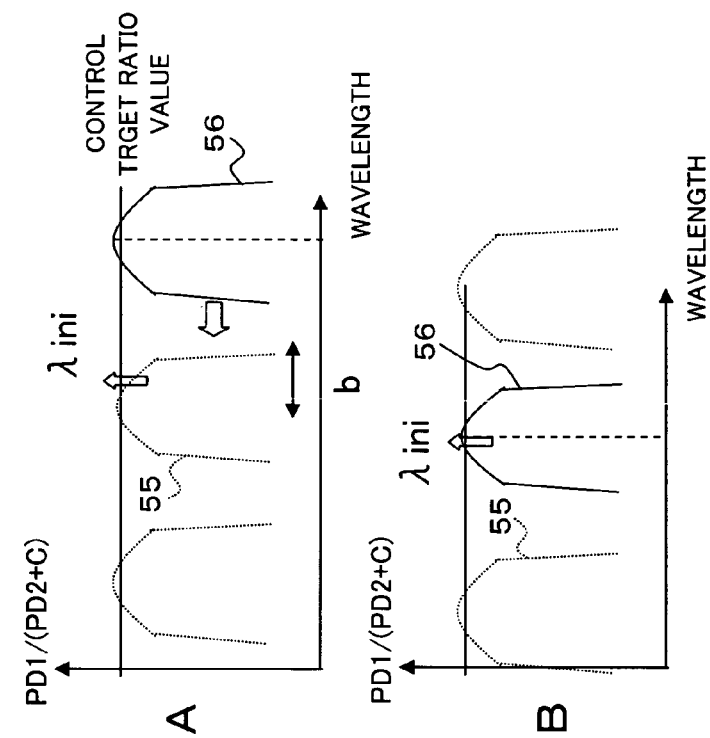
FIG. 11A
FIG. 11B
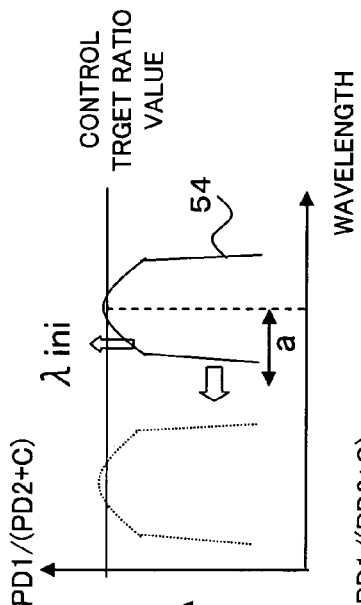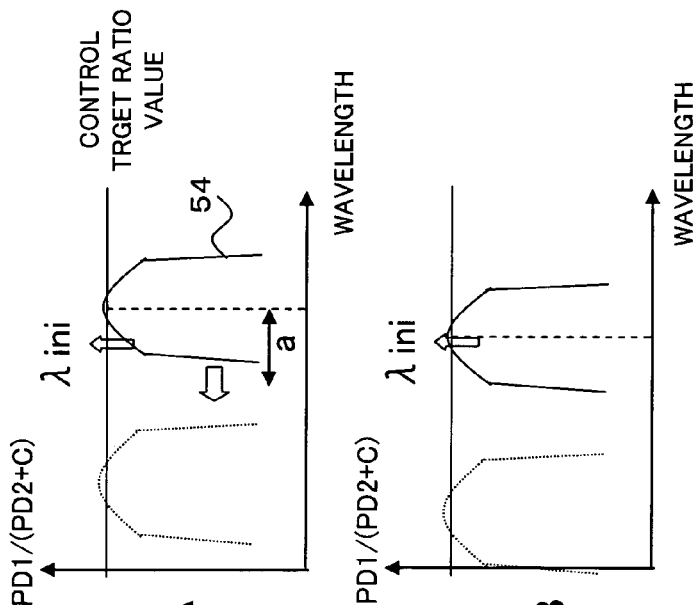
FIG. 10A
FIG. 10B

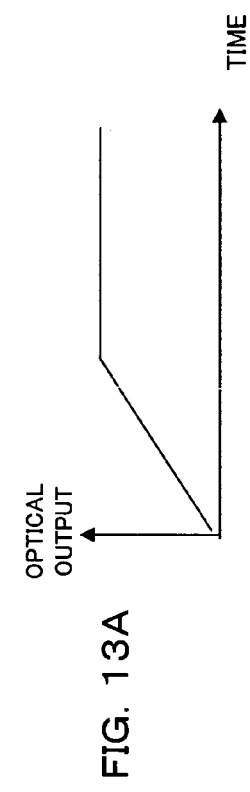
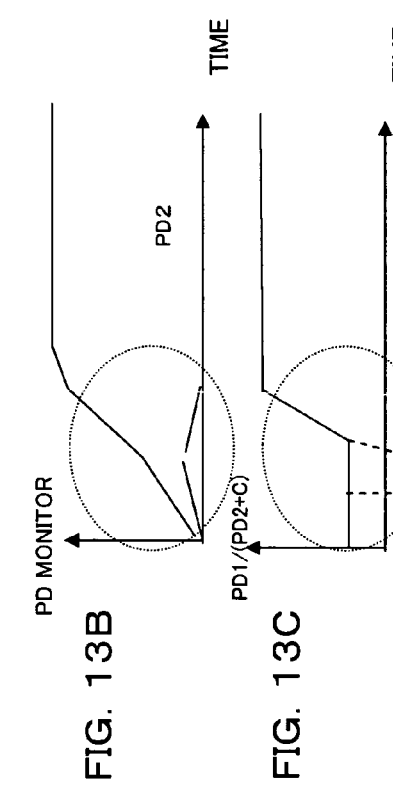
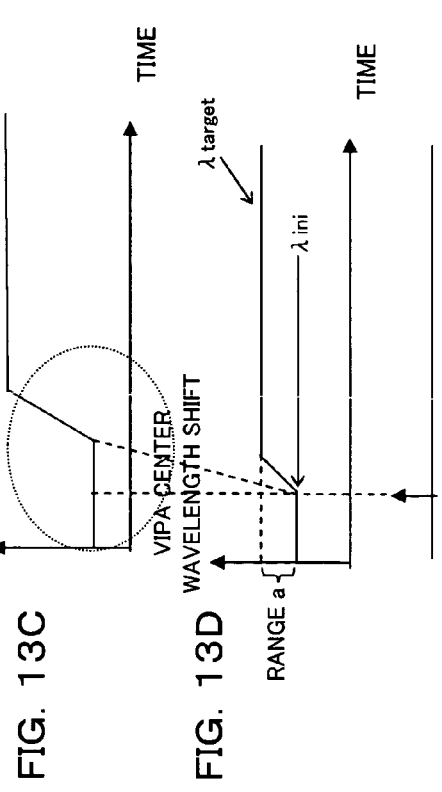
FIG. 12A
FIG. 12B
FIG. 12C
FIG. 12D
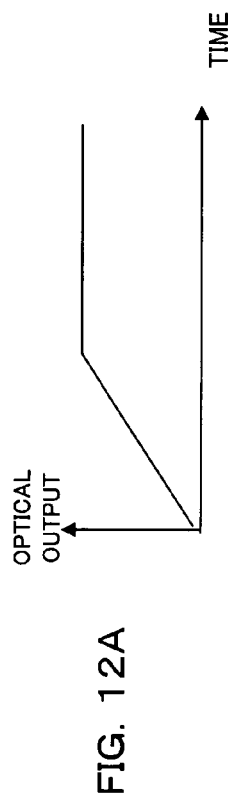
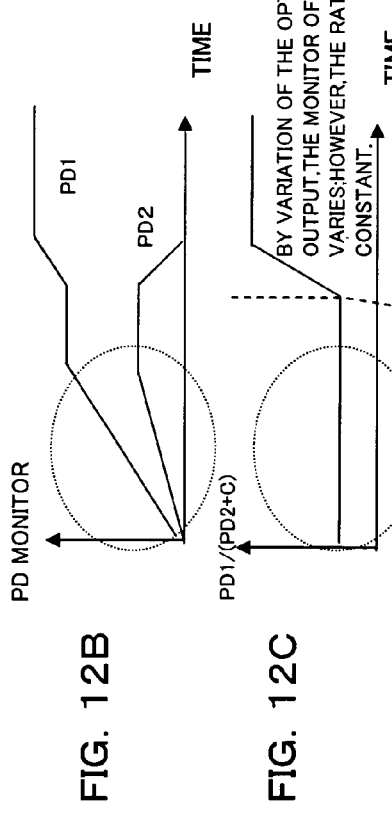
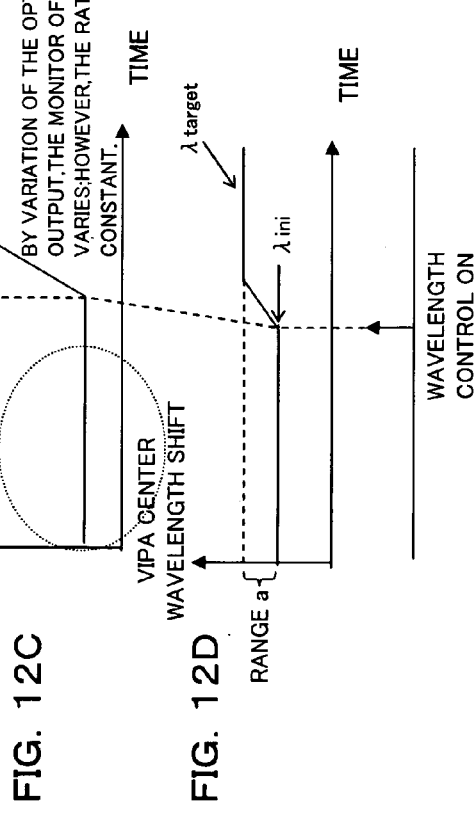
FIG. 13A
FIG. 13B
FIG. 13C
FIG. 13D

DISPERSION COMPENSATING DEVICE AND OPTICAL TRANSMISSION SYSTEM

CROSS REFERENCE TO RELATED APPLICATIONS

This application is based on and hereby claims priority to Japanese Application No. 2004-326380 filed on Nov. 10, 2004 in Japan, the contents of which are hereby incorporated by reference.

BACKGROUND OF THE INVENTION (1) Field of the Invention

The present invention relates to a dispersion compensating device and an optical transmission system, and more particularly to a technique suitable for a dispersion compensating device and an optical transmission system using VIPA (Virtually Imaged Phased Array).

(2) Description of Related Art

In an optical transmission system, dispersion compensation must be carried out when the wavelength dispersion of a transmission line is large. As a dispersion compensator, a fiber type (what is known as DCM) is general. However, in recent years, a dispersion compensator that is not a fiber type, such as VIPA, Ethalon, Fiber Bragg Grating (FBG), or waveguide resonance type, has been realized. Here, as a device using the VIPA, a technique proposed by the later-mentioned Japanese Patent Application Laid-Open No. 2003-294999 is known, for example.

Among these, the VIPA enables dispersion compensation with a simple and compact construction, and also the dispersion compensation amount can be varied, so that the VIPA is a highly prospective dispersion compensating device. However, since the VIPA has a structure that uses resonance, the VIPA has a property such that the pass band in which the dispersion compensation can be carried out is periodic, and the pass band width at each wavelength is limited (pass band is narrow). For example, FIG. 19 is a model view showing one example of pass band characteristics of the VIPA. As illustrated in the top of FIG. 19, the peaks (center wavelengths) of the pass band characteristics (which may hereafter be simply referred to as "passage characteristics") appear periodically at an extremely narrow interval such as 50, 100, or 200 GHz. The bottom of FIG. 19 shows the group delay characteristics to the wavelength, and shows how the group delay is shifted from 0 according as the wavelength is shifted from the aforementioned peaks. Additionally, as a technique related to VIPA, technique proposed in Japanese Patent Application Laid-Open No. 2003-294999.

For this reason, in a non-WDM (Wavelength Division Multiplexing) system, a dispersion compensator (DCM) whose pass band is a wide band is generally used instead of using a periodic wavelength dispersion compensator [hereafter referred to as periodic (or periodic type) dispersion compensator] in which the pass band where the dispersion compensation can be carried out is a narrow band and the peaks of transmittance repeatedly appears at a predetermined interval, such as VIPA or Ethalon filter.

On the other hand, when a periodic dispersion compensator is to be used in a WDM transmission system, since the pass band in which the dispersion compensation can be carried out is a narrow band and periodic as described above, the transmission wavelength of a light source (optical transmitter) must be stabilized at a high precision to the grid wavelength of ITU (International Telecommunication Union) standard (hereafter referred to as ITU grid wavelength) $\lambda_{Itu}$, and the transmittance wavelength (pass band characteristics) of the periodic dispersion compensator must be stabilized to the ITU grid wavelength $\lambda_{Itu}$. For this reason, as shown in FIG. 20, an optical transmitter 100 is provided with a wavelength detecting circuit 103, an LD temperature controlling circuit 104, and the like for wavelength stabilization (wavelength lock) in addition to an LD module 101 incorporating a light source (LD) 1010 such as a semiconductor laser and a wavelength variation detecting circuit 1011, and an LD current controlling circuit 102, whereby the wavelength variation (error) is detected by receiving the wavelength variation information obtained by the wavelength variation detecting circuit 1011 with the wavelength detecting circuit 103, and the transmission wavelength of the optical transmitter 100 is stably equalized to the corresponding ITU grid wavelength by controlling the temperature of the light source 101 (for example, controlling the Peltier element provided in the light source 1010) with the LD temperature controlling circuit 104 so that the detection error will be minimized. On the other hand, the passage characteristics of periodic dispersion compensator 200 is stabilized to the ITU grid wavelength by temperature stabilization or the like.

In this manner, by sufficiently equalizing and stabilizing both the transmission wavelength of the optical transmitter 100 and the pass band characteristics of the periodic dispersion compensator 200 to the ITU grid wavelength, stable dispersion compensation characteristics can be obtained. Here, in FIG. 20, reference numeral 105 represents an external modulator (for example, LN modulator or the like) that modulates the light from the light source 101 with a transmission signal (data). This external modulator 105 is not needed in the case of a direct modulation system. Further, the arrow shown with a thick solid line represents an electric signal line, and the arrow shown with a thin solid line represents an optical signal line.

Here, as a conventional technique related to wavelength stabilization, techniques proposed in Japanese Patent Application Laid-Open No. 2000-323784, Republication of International Laid-open Patent Publication WO97/34379, and Japanese Patent Application Laid-Open No. 2003-218461, and Japanese Patent Application Laid-Open No. 2003-294999 are known, for example.

Here, the technique of Japanese Patent Application Laid-Open No. 2000-323784 provides a multiple wavelength stabilizing apparatus in which, when a tunable laser is used as a spare laser, all of the plural wavelengths that can be output from the tunable laser can be stabilized, and also the drawing range can be widened. For this reason, the multiple wavelength stabilizing apparatus of Japanese Patent Application Laid-Open No. 2000-323784 is constructed to include an interferometer that makes the incident light interfere at a period corresponding to double the wavelength interval of the channel in the WDM system and outputs the interference light through two ports by shifting at half the period, first and second detecting means for respectively detecting the output light intensities from the aforesaid ports, and controlling means for determining whether the channel fixed to a predetermined wavelength is even or odd and performing control so that the output wavelength of the laser light source will be the predetermined wavelength on the basis of the determination result and the output of the aforesaid detecting means.

Then, in this multiple wavelength stabilizing apparatus, the output wavelength of the laser light source can be fixed to the predetermined wavelength by determining whether the channel of the predetermined wavelength is an even channel or an odd channel and giving a controlling signal to the laser light source so that the detected ratio value (PDo1/PDo2) of the output (PDo1) of the first detecting means divided by the output (PDo2) of the second detecting means will be a target value. Further, since the same value of PDo1/PDo2 appears at a period of double the channel wavelength interval respectively between the even channels and between the odd channels, the drawing range of each channel can be made to be double the channel wavelength interval with its center being at the predetermined wavelength.

The technique of Republication of International Laid-Open Patent Publication WO97/34379 relates to an optical transmission apparatus in which an optical fiber grating (FBG) is used for dispersion compensation, where a dispersion compensation FBG having a narrow band is disposed in a transmitter, and a dispersion compensation FBG in which the center wavelength is set in advance to be equal to the center wavelength of the transmitter side FBG at a center temperature of use is disposed in a receiver. Then, on the transmitting side, the wavelength of the transmission light source is stabilized to the center wavelength of the transmitting side FBG with a wavelength stabilizing circuit, and simultaneously the dispersion compensation is carried out, whereas on the receiving side, the dispersion compensation is carried out by the receiving side FBG, so as to suppress the deterioration caused by the self phase modulation effect (SPM). Further, by setting the wavelength band width of the aforesaid transmitting side FBG to be narrower than the wavelength band width of the receiving side FBG, the transmission wavelength can be made to fall within the reflection band of the receiving side FBG even if a temperature change occurs independently on the transmitting side and on the receiving side. Also, the wavelength band width required in the receiving side FBG can be reduced.

Furthermore, the technique of Japanese Patent Application Laid-Open No. 2003-218461 relates to a method and a system that enables wavelength stabilization with a simple construction by using QCSE photodetection that can serve both as a filter and a detector, where the photocurrent of the emitted light from one light source is detected respectively by the first and second QCSE photodetectors that operate by receiving supply of different bias voltages, and the output wavelength of the light source can be stabilized to a predetermined wavelength by controlling the light source so that the detected photocurrents may be equal to each other.

However, as described above, since a periodic dispersion compensator has a restricted pass band (narrow band) relative to the wavelength, the wavelengths of the light source and the dispersion compensator must be equalized at a high precision and, as a technique therefor, it is necessary to devise to stabilize the temperature of the dispersion compensator and also to devise to stabilize the light source by incorporating a wavelength locking function therein. As a result of this, the light source and the dispersion compensator both will have a complex construction, thereby raising a problem of high costs.

Also, in a long distance transmission system of non-WDM, since a light source that does not need to be stabilized to the ITU grid wavelength is used, there is a problem in that a dispersion compensator having periodic pass band characteristics cannot be usually applied.

Further, also in a WDM transmission system, it is inefficient as described above to perform stabilization both on the light source side and on the dispersion compensator side and, when numerous dispersion compensators are used in the system, wavelength stability of higher precision is required. Also, in a long distance transmission system of WDM, when periodic wavelength dispersion compensators are to be used in plural optical relay nodes constituting the system, the wavelength stabilization of the dispersion compensators of all the nodes and the wavelength stabilization of the transmitting light source must be carried out individually for all. This is not preferable because the system as a whole will be highly costly.

Also, since the techniques of the aforementioned Japanese Patent Application Laid-Open No. 2000-323784, and Japanese Patent Application Laid-Open No. 2003-218461 are directed to a technique of wavelength stabilization singly on the transmission side, so that the relationship between the transmission wavelength and the pass band characteristics of the dispersion compensator is not considered at all. On the other hand, according to the technique of the aforementioned Republication of International Laid-open Patent Publication WO97/34379, the light source and the dispersion compensator both will not have a complex construction because the transmission wavelength is stabilized to the center wavelength of the transmitting side narrow band FBG disposed in the transmitter and having a dispersion compensating function, as described above. However, various problems are raised because the output wavelength of the light source is controlled.

Namely, in order to control the output wavelength of the light source, it is general to control the temperature by using a Peltier element or the like. However, the electric power consumption will increase, and a large load is imposed on the light source depending on the variation range of the output wavelength, which may become a factor inviting decrease of the life time of the light source or generation of abnormality. Also, when the center light-emission wavelength is changed, an unexpected output power variation may occur, thereby raising a fear of giving adverse effects on the overall system. Further, in the case of a WDM transmission system, since it is general to stabilize the output wavelength of the light source to the ITU grid wavelength as already described, a technique of changing the output center light-emission wavelength of the light source such as disclosed in the aforementioned Republication of International Laid-Open Patent Publication WO97/34379 cannot be applied.

In addition, according to the technique of the aforementioned Republication of International Laid-Open Patent Publication WO97/34379, an optical coupler must be inserted in the main signal transmission system (output fiber) to monitor the output light (main signal light) of the dispersion compensator (FBG) for wavelength stabilization. The insertion loss generated by this will equivalently be the loss of the dispersion compensator, thereby raising a problem of increase in the loss.

SUMMARY OF THE INVENTION

The present invention has been devised in view of the above-mentioned problems, and an object thereof is to provide a dispersion compensating device and an optical transmission system in which the passage characteristics of the dispersion compensating device (VIPA) can be equalized to the input light wavelength (output wavelength of light transmitter) in a highly stable manner while restraining the loss of main signal light to the minimum.

In order to achieve the aforementioned object, a dispersion compensating device according to the present invention includes: a virtually imaged phased array (VIPA) plate which is an optical component having two first and second reflecting surfaces that are opposite and parallel to each other, where light that has been converged in one-dimensional direction is incident between said two reflecting surfaces and, while the incident light is being multiply reflected at the two reflecting surfaces, a part of the light is transmitted through said second reflecting surface, and the transmitted light interferes to output substantially linearly dispersed light at an angle that is different depending on a wavelength; a lens that converges the light of each wavelength that is output from said optical component; a mirror having a reflecting surface that reflects the light converged by passing through said lens, where the reflecting surface has a shape capable of giving a constant wavelength dispersion to the light of each wavelength that is output from said optical component with respect to a direction substantially parallel to an angle dispersion direction at said optical component, and a shape capable of giving a different wavelength dispersion to the light of each wavelength that is output from said optical component with respect to a direction substantially perpendicular to the angle dispersion direction at said optical component; and high reflectivity side monitor means for monitoring the light that is input into the VIPA plate and emitted from said first reflecting surface.

Here, the dispersion compensating device may further include low reflectivity side monitor means for monitoring the light that is emitted from the surface having the lower reflectivity of the VIPA plate.

Also, the dispersion compensating device may further include controlling means for controlling passage characteristics of the VIPA plate to wavelength so that a monitor result obtained by the high reflectivity side monitor means may become a predetermined value.

Further, the dispersion compensating device may include controlling means for controlling passage characteristics of the VIPA plate so that a monitor ratio value which is a ratio of monitor results obtained by the high reflectivity side monitor means and the low reflectivity side monitor means may fall within a constant range.

Also, an optical transmission system according to the present invention includes an optical transmitter that transmits light of predetermined wavelength and a dispersion compensating device that compensates wavelength dispersion of the light transmitted from the optical transmitter, wherein the dispersion compensating device includes a VIPA plate in which the reflectivity of one surface thereof is set to be higher than the reflectivity of the other surface thereof, high reflectivity side monitor means that monitors the light that is input into the VIPA plate and emitting at least from the surface having the higher reflectivity of the VIPA plate, and controlling means for controlling passage characteristics of the VIPA plate to wavelength so that a monitor result obtained by the high reflectivity side monitor means may become a predetermined value.

According to the present invention described above, the light emitted from the surface having the higher reflectivity of the VIPA plate can be monitored, so that the main signal light can be monitored without inserting an optical coupler to the light emitted from the surface having the lower reflectivity (i.e. the main signal light that passes through the VIPA plate). Then, by controlling the passage characteristics of the VIPA plate in accordance with the monitor result, the passage characteristics of the VIPA plate can be made to follow so as to be equal to the input light wavelength (output wavelength of the optical transmitter), whereby the passage characteristics of the VIPA plate can be equalized to the input light wavelength in a highly stable manner while restraining the loss of main signal light to the minimum, thereby obtaining good main signal light transmission characteristics and dispersion compensation characteristics.

Also, by controlling the passage characteristics of the VIPA plate with a monitor ratio value which is a ratio of monitor results obtained by the high reflectivity side monitor means and the low reflectivity side monitor means, the change in the passage characteristics can be grasped by separating it from the change in the input light power. Therefore, even if the input light power changes to invite variation in the output light power of the VIPA plate, confusion with the variation in the wavelength can be prevented.

Therefore, the wavelength stabilization precision can be improved, and the danger of erroneous operation caused by the output wavelength not being an expected wavelength can be avoided. As a result of this, even if a change in the input light power to the VIPA plate inevitably occurs such as in starting the device, the wavelength control can be carried out even in the middle of the variation of the output light of the VIPA plate because the wavelength control is carried out on the basis of the input and output power ratio of the VIPA plate. This eliminates the need for awaiting (stopping) the wavelength control until the output light power is stabilized, thereby reducing the time needed until the wavelength control (i.e. the time needed until the wavelength stabilization).

BRIEF DESCRIPTION OF THE DRAWINGS

FIGS. 5A and 5B are views for describing a wavelength controlling procedure in the dispersion compensating device shown in FIG. 1;

FIGS. 6A and 6B are views for describing a wavelength controlling procedure in the dispersion compensating device shown in FIG. 1;

FIG. 7 is a block diagram showing a construction when sequence control is carried out in the construction of FIG. 1;

FIGS. 10A and 10B are views for describing a wavelength controlling procedure in the dispersion compensating device shown in FIG. 8;

FIGS. 11A and 11B are views for describing a wavelength controlling procedure in the dispersion compensating device shown in FIG. 8;

FIGS. 12A to 12D are views for describing a controlling procedure when the wavelength control is carried out by sequence control at the time of starting the device (wavelength) in the construction shown in FIG. 8;

FIGS. 13A to 13D are views for describing a wavelength controlling procedure at the time of starting the device (wavelength) in the construction shown in FIG. 8;

DESCRIPTION OF THE PREFERRED EMBODIMENTS

[A] Description of the First Embodiment

Figure 1:
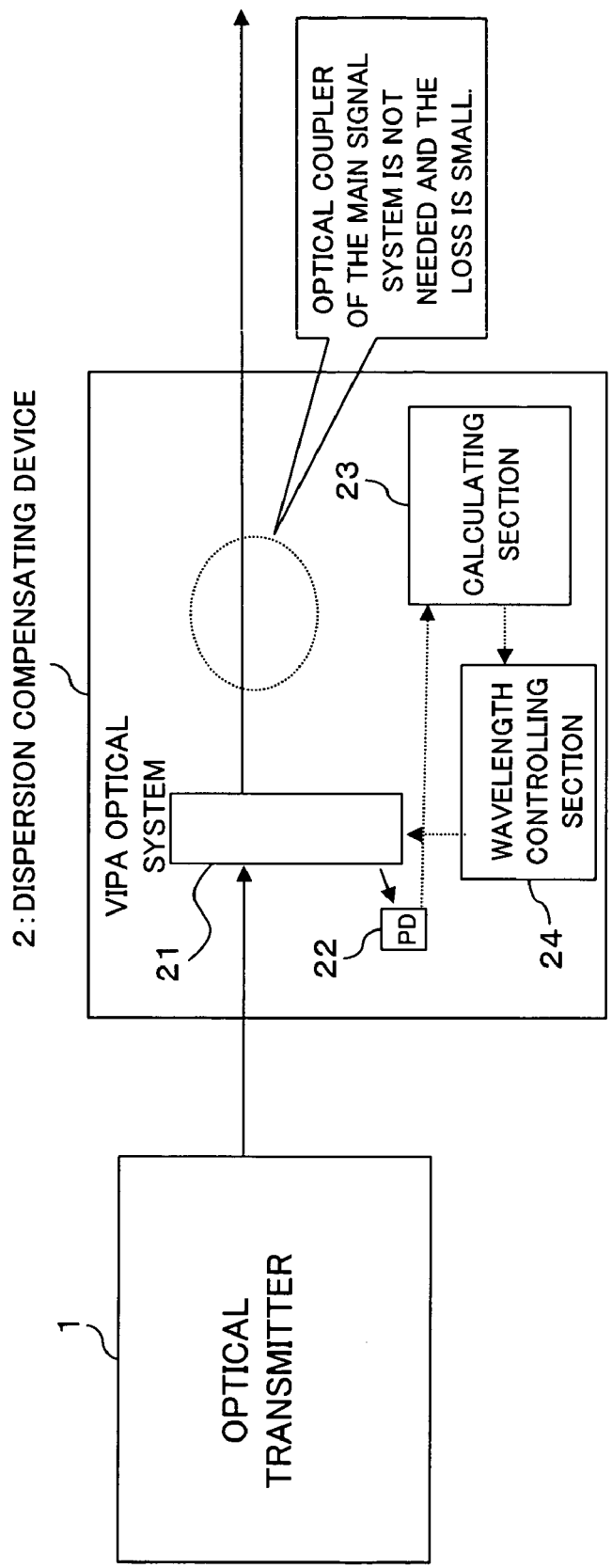
FIG. 1 is a block diagram showing a construction of a dispersion compensating system (optical transmission apparatus) to which a VIPA type dispersion compensator having a wavelength monitoring function according to the first embodiment of the present invention.

FIG. 1 is a block diagram showing a construction of a dispersion compensating system (optical transmission apparatus) to which a VIPA type dispersion compensator having a wavelength monitoring function according to the first embodiment of the present invention. This system shown in FIG. 1 is configured to include an optical transmitter 1 and a dispersion compensating device 2 connected to this optical transmitter 1 via an optical transmission line (optical fiber) to compensate for the wavelength dispersion of the input light. Dispersion compensating device 2 is further configured to include a VIPA optical system 21, a photodiode (PD) 22 serving as a photoreceptor, a calculating section 23, and a wavelength controlling section 24.

Here, the optical transmitter 1 has a light source (not illustrated) that transmits light of a specific wavelength, where the output wavelength of the light source (hereafter also referred to as light source wavelength) is set to be equal, for example, to the ITU grid wavelength. However, in this embodiment, in order to control the passage characteristics of the VIPA optical system 21 to equalize the peak (center wavelength) of the passage characteristics to the center wavelength of the light source wavelength as will be described later, the optical transmitter 1 has a construction that does not need a wavelength locker function.

Here, the aforesaid output wavelength is not necessarily be the ITU grid wavelength, so that the present invention can be applied to any output wavelength.

Then, the principal part of the dispersion compensating device 2 is configured to include a VIPA plate which is an optical component having two first and second reflecting surfaces that are opposite and parallel to each other, where light that has been converged in one-dimensional direction is incident between said two reflecting surfaces and, while the incident light is being multiply reflected at the two reflecting surfaces, a part of the light is transmitted through said second reflecting surface, and the transmitted light interferes to output substantially linearly dispersed light at an angle that is different depending on a wavelength; a lens that converges the light of each wavelength that is output from the optical component; and a mirror having a reflecting surface that reflects the light converged by passing through the lens, where the reflecting surface has a shape capable of giving a constant wavelength dispersion to the light of each wavelength that is output from said optical component with respect to a direction substantially parallel to an angle dispersion direction at said optical component, and a shape capable of giving a different wavelength dispersion to the light of each wavelength that is output from said optical component with respect to a direction substantially perpendicular to the angle dispersion direction at said optical component.

Also, in this embodiment, in the dispersion compensating device 2, the VIPA optical system 21 is a dispersion compensator receiving input light having each wavelength in a continuous wavelength region, allowing multiple interference of the input light to create output light that makes each wavelength in the aforesaid continuous wavelength region be spatially distinguishable (having an emission angle corresponding to the wavelength of the incident light), and being capable of performing wavelength dispersion compensation by changing the optical path length of the reflected light in accordance with the wavelength, and is an optical device having passage characteristics periodic to the input wavelength (characteristics such that the peak of the transmittance repeatedly appears at a certain interval periodically to the wavelength) and being capable of controlling the transmittance wavelength characteristics. Then, the VIPA plate (angle dispersion element) used in the VIPA optical system 21 in this embodiment is adapted to allow leakage of light from the higher reflectivity side by letting the reflectivity on the higher reflectivity side be less than 1, and to allow this leakage light to be received by the PD (high reflectivity side monitor means) 22 as monitor light of the main signal light.

Figure 2:
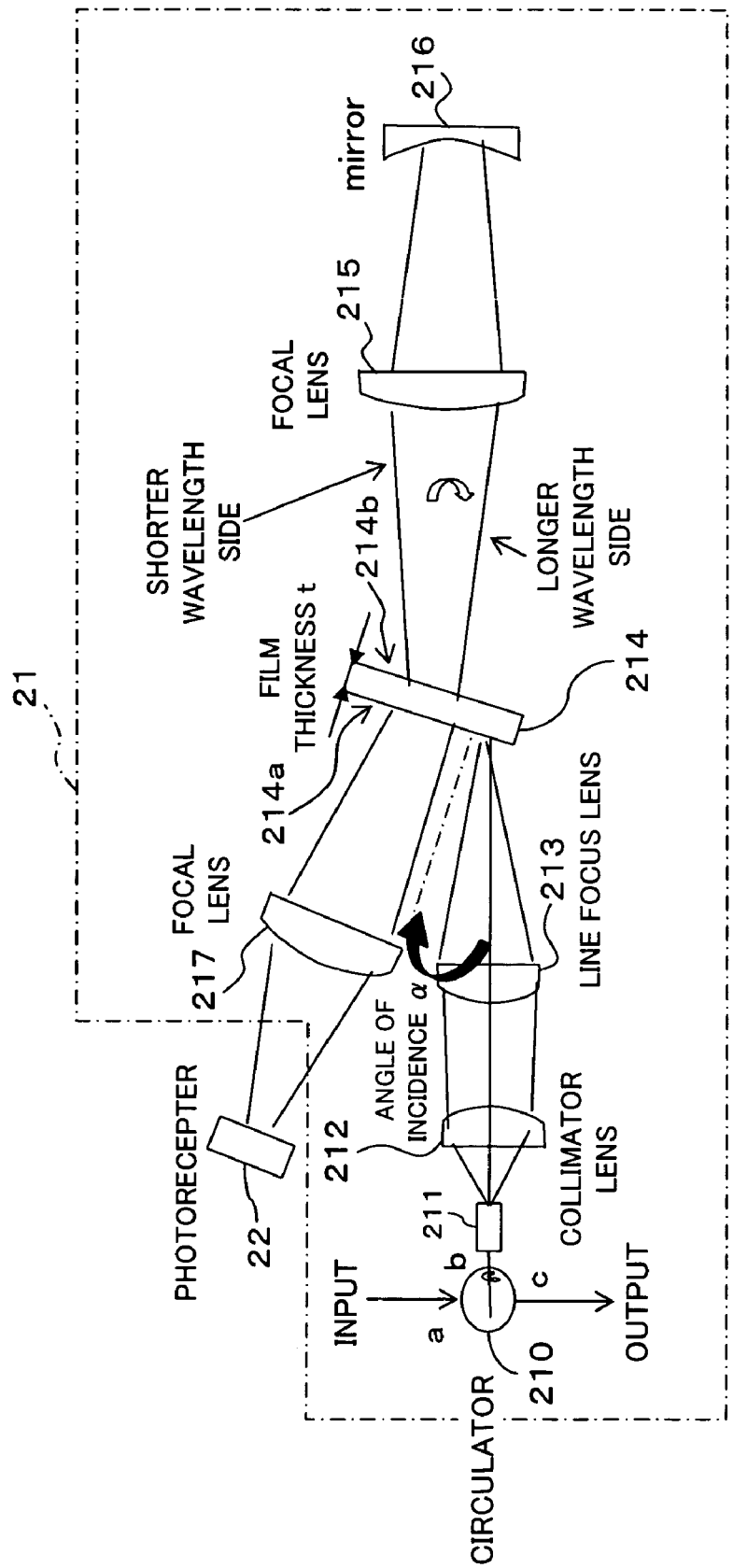
FIG. 2 is a block diagram showing a construction of the VIPA optical system shown in FIG. 1.

For this purpose, specifically the present VIPA optical system 21 is configured to include an optical circulator 210, an optical fiber 211, a collimator lens 212, a line focus lens 213, a VIPA plate 214, focal lenses 215, 217, and a reflecting mirror 216, as shown in FIG. 2, for example.

The optical circulator 210 functions to guide the light from port a to port b, i.e. to the VIPA plate 214 side, and to guide the light from port b, i.e. the reflected light from the VIPA plate 214 side, to port c; the collimator lens 212 receives and collimates the light emitted from the input optical fiber 211 to output the collimated light; and the line focus lens 213 linearly converges the light from the collimator lens 212 to let the linearly converged light be input into a radiation window (not illustrated) of the VIPA plate 214.

The VIPA plate 214 is constructed by coating the two surfaces of a thin plate (glass plate) having a film thickness t with a reflecting film (input side reflecting surface 214a and output side reflecting surface 214b) so as to allow multiple reflection of the light incident from the aforesaid radiation window in the inside to induce multiple interference. Here, in an ideal VIPA plate 214, the input side reflecting surface 214a is constructed to have a reflectivity of 100% at the parts other than the aforesaid radiation window, and the output side reflecting surface 214b is constructed to have a reflectivity of about 95%, i.e. so that about 5% of the light incident into the output side reflecting surface 214b will be transmitted and the rest of the light (about 95% of the light) will be reflected. However, in this embodiment, the reflectivity of the input side reflecting surface 214a which is the higher reflectivity side is intentionally set to have a value of less than 100% though being sufficiently close to 100% so that part of the light will be leaked out not only to the output side but also to the input side.

Therefore, in the VIPA plate 214 of this embodiment, light will be leaked out in a direction that is different depending on the wavelength from both of the reflecting surfaces 214a, 214b on the input and output sides. In this case, the leakage light emitted from the reflecting surfaces 214a, 214b of the VIPA plate 214 will have periodic passage characteristics (characteristics such that the peak of the transmittance repeatedly appears at a certain interval periodically to the wavelength) that are inverted from each other.

The focal lens 215 converges the light (transmitted light) emitted from the output side reflecting surface 214b of the VIPA plate 214 in a direction that is different depending on the wavelength (in FIG. 2, the upper side of the document sheet is the shorter wavelength side, and the lower side is the longer wavelength side), and lets the converged light be incident into the reflecting mirror 216. The reflecting mirror 216 has a three-dimensional curved surface shape on the light incidence side, and functions to reflect the light from the focal lens 215. The reflected light passes through the focal lens 215, the VIPA plate 214, the line focus lens 213, the collimator lens 212, and the input optical fiber 211 to be input into the optical circulator 210, and is outputted from port c.

Figure 4:
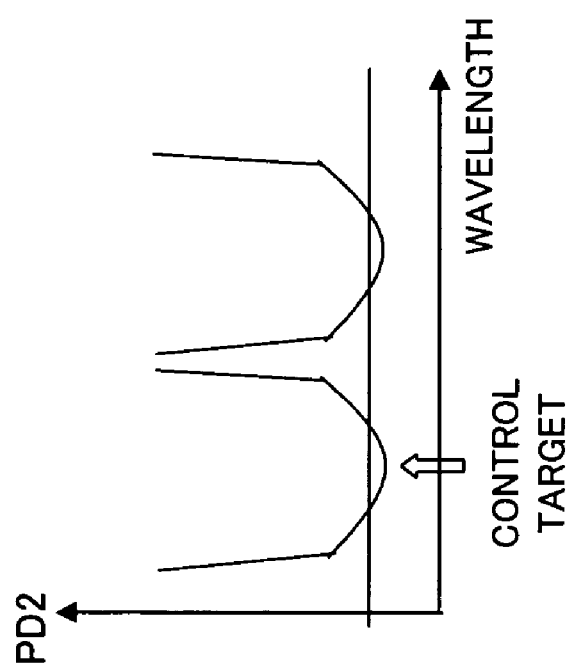
FIG. 4 is a view showing a monitor characteristics example of the leakage light from the input side (high reflectivity side) reflecting surface of the VIPA plate shown in FIG. 2 relative to the wavelength.

The other focal lens 217 converges the leakage light (transmitted light) from the input side reflecting surface 214a of the VIPA plate 214 and lets the converged light be incident into the PD 22 as monitor light of the main signal light. Here, the characteristics of the monitor value (PD2) of the leakage light from the input side reflecting surface 214a of the VIPA plate 214 relative to the wavelength are characteristics having a periodic bottom as shown in FIG. 4, for example.

Figure 3:
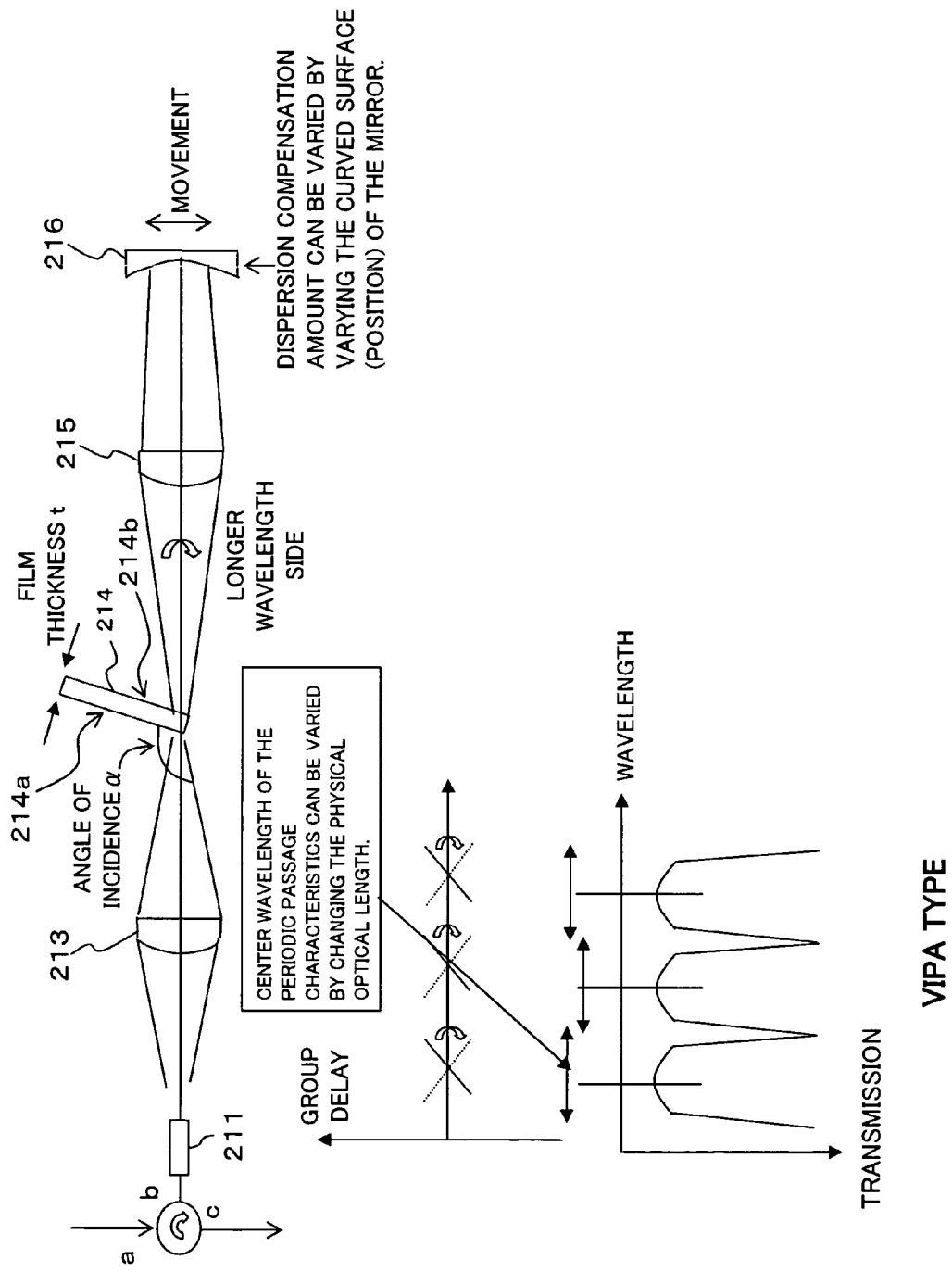
FIG. 3 is a view for describing a wavelength setting changing technique of the VIPA optical system shown in FIG. 1.

In the VIPA optical system 21 of this embodiment having such a configuration, the center wavelength of the periodic passage characteristics (peaks of transmittance) can be varied by varying the incidence angle a of the incident light to the VIPA plate 214, as shown in a model view of FIG. 3, for example. Also, by translating the reflecting mirror 216 in parallel (moving in the up-and-down direction of the document sheet in FIG. 3) to change the curved mirror surface at the light convergence position of the light from the focal lens 215, the change amount of the optical path length of the reflected light can be varied in the wavelength band of the light incident onto the reflecting mirror 216 to vary the dispersion compensation amount. In addition to this, by allowing the leakage light from the input side reflecting surface 214a of the VIPA plate 214 to be incident into the PD 22 as monitor light, the main signal light can be monitored without using an optical coupler as in a conventional art.

Here, in the VIPA optical system 21, the peak (center wavelength) of the periodic passage characteristics can be varied by changing the physical optical length, i.e. by changing the film thickness t of the VIPA plate 214 (by changing a gap length when a dielectric substance is present between the mirrors constituting the VIPA plate 214) or, when a dielectric substance is present between the mirrors constituting the VIPA plate 214, by changing the refractive index thereof, instead of changing, for example, the light incidence angle a of the VIPA plate 214.

In the meantime, referring to FIG. 1, the calculating section 23 obtains a monitor value on the basis of the voltage signal that is obtained in accordance with the amount of the monitor light received at the PD 22, and the wavelength controlling section 24 controls the passage characteristics of the VIPA plate 214 (translates the reflecting mirror 216 in parallel as described above) so that the monitor value obtained by this calculating section 23 will be the minimum (predetermined value; control target value), and these constitute the controlling means for controlling the passage characteristics of the VIPA plate 214 to wavelength so that the monitor result obtained by the PD 22 will be a predetermined value.

When the wavelength λini of the input light from the optical transmitter 1 (light source) is shifted towards the shorter wavelength side from the center wavelength (bottom) of a specific passage characteristic (See the solid line 51) among the periodic passage characteristics of the VIPA optical system 21 (VIPA plate 214) (is within the wavelength range a) at the time of starting the device or the like as shown, for example, in FIG. 5A, wavelength controlling section 24 controls to increase the aforesaid incidence angle a to shift the passage characteristic 51 towards the shorter wavelength side as shown in FIG. 5B so as to minimize the monitor output obtained by the PD 22, whereby the input light wavelength λini and the center wavelength of the aforesaid specific passage characteristic 51 of the VIPA plate 214 are made equal to each other.

On the other hand, when the input light wavelength λini is shifted towards the longer wavelength side from the center wavelength (bottom) of a specific passage characteristic (See the broken line 52) among the periodic passage characteristics of the VIPA optical system 21 (VIPA plate 214) (is within the wavelength range b) as shown, for example, in FIG. 6A, the wavelength controlling section 24 also in this case controls to increase the aforesaid incidence angle a to shift the passage characteristic towards the shorter wavelength side as shown in FIG. 6B to shift the center wavelength of the passage characteristic (See the solid line 53), which is adjacent on the longer wavelength side, towards the shorter wavelength (input light wavelength λini) side, so as to minimize the monitor output obtained by the PD 22 in relation to the passage characteristic 53, whereby the input light wavelength λini and the center wavelength of the aforesaid specific passage characteristic 53 of the VIPA plate 214 are made equal to each other.

In other words, when the input light wavelength λini is shifted towards the longer wavelength side from the center wavelength of a specific passage characteristic among the periodic passage characteristics of the VIPA optical system 21 (VIPA plate 214), the wavelength controlling section 24 shifts the passage characteristic not towards the longer wavelength side (inverse direction) but in the same direction (towards the shorter wavelength side) as when the input light wavelength λini is shifted towards the shorter wavelength side, whereby the wavelength λini of the light source and the center wavelength of the passage characteristic of the VIPA optical system 21 are made equal to each other.

Therefore, the wavelength control is more simplified as compared with the case of performing a dithering operation by making specific passage characteristics to be shiftable both towards the longer wavelength side and the shorter wavelength side, thereby greatly contributing to the reduction of electric power consumption and circuit scale. Here, in this example, the shift towards the shorter wavelength side has been described; however, the shift towards the longer wavelength side maybe implemented as well. Namely, when shifted either towards the shorter wavelength side or the longer wavelength side, shift in one direction may be implemented.

Also, when optical transmitter 1 (light source) is started, the wavelength control by the wavelength controlling section 24 follows the variation of the input light power to the VIPA optical system 21, so that it is preferable to add a sequence controlling section 24*a* as shown, for example, in FIG. 7, whereby the sequence controlling section 24*a* performs ON control of the optical transmitter 1 (light source) in the state in which the wavelength control over the VIPA optical system 21 by the wavelength control section 24 is made OFF, and thereafter the wavelength control over the VIPA optical system 21 by the wavelength controlling section 24 is controlled to be in the ON state (i.e. the sequence control is carried out) when the output power of the optical transmitter 1 (light source) becomes sufficiently stable.

Conversely, in performing OFF control of the optical transmitter 1 (light source), the wavelength control is controlled to the OFF state after the setting to the VIPA optical system 21 in the state in which the wavelength stabilization by the wavelength controlling section 24 is completed is stored into a memory or the like, and thereafter the optical transmitter 1 (light source) is subjected to OFF control. Such a procedure can shorten the time needed until wavelength stabilization at the time of starting the optical transmitter 1 (light source) next time.

As described above, according to this embodiment, by monitoring the main signal light without inserting an optical coupler to the main signal light system and controlling the passage characteristics of the VIPA optical system 21 (VIPA plate 214) in accordance with the monitor result, the center wavelength of the passage characteristics of the dispersion compensator 21 can be made to follow so as to be equal to the output wavelength of the optical transmitter 1 (light source), whereby the passage characteristics of the VIPA optical system (dispersion compensator) 21 can be equalized to the output wavelength of the optical transmitter 1 in a highly stable manner while restraining the loss of main signal light to the minimum, thereby obtaining good main signal light transmission characteristics and dispersion compensation characteristics.

In addition, in this example, the passage characteristics of the dispersion compensator 21 are changed by mechanical control without changing the center light-emission wavelength of the transmitter 1 (light source), so that the electric power consumption can be reduced and also the load imposed upon the transmitter 1 (light source) can be alleviated. Also, an unexpected output power variation caused by the change in the center light-emission wavelength of the transmitter 1 (light source) can be prevented.

[B] Description of the Second Embodiment

Figure 8:
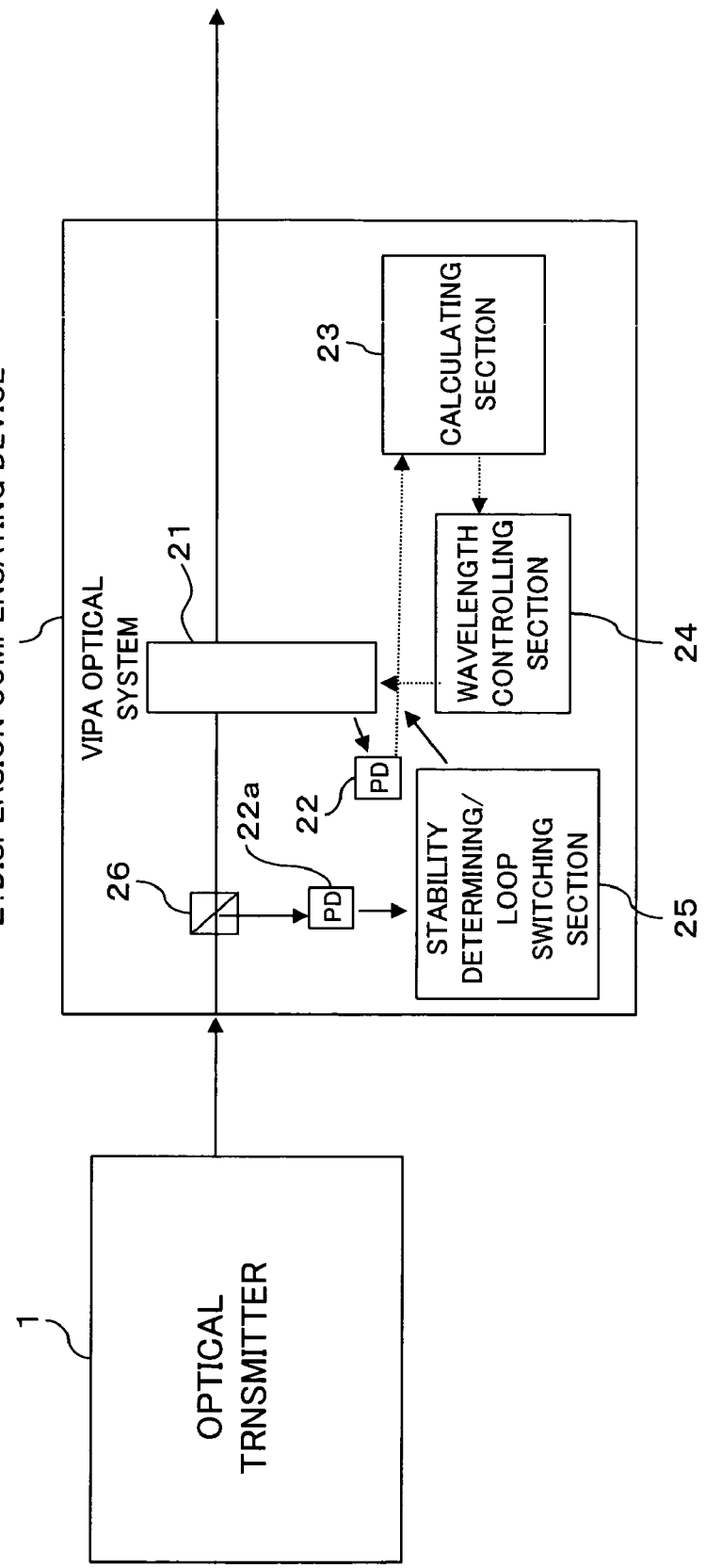
FIG. 8 is a block diagram showing a construction of a dispersion compensating system (optical transmission apparatus) to which a VIPA type dispersion compensator having a wavelength monitoring function according to the second embodiment of the present invention.

FIG. 8 is a block diagram showing a construction of a dispersion compensating system (optical transmission apparatus) to which a VIPA type dispersion compensator having a wavelength monitoring function according to the second embodiment of the present invention. This system shown in FIG. 8 is different from the system described above with reference to FIG. 1 in that an optical coupler 26 and an input PD 22*a* are added on the input side of the VIPA optical system 21, and a stability determining/loop switching section 25 is added in the dispersion compensating device 2. Here, the other constituent elements denoted with already described reference symbols are identical or similar to those already described unless specifically mentioned otherwise.

Here, the optical coupler 26 branches part of the light (main signal light) input from the optical transmitter 1 to the VIPA optical system 21 and inputs it into the input PD 22*a* as monitor light. The input PD 22*a* inputs a voltage signal corresponding to the amount of the received monitor light into the stability determining/loop switching section 25.

Also, the stability determining/loop switching section 25 determines the stability of the input light power by monitoring the input voltage value (monitor value) from the aforesaid input PD 22*a*, and controls ON/OFF of the wavelength control performed by the wavelength controlling section 24. In this embodiment, the stability determining/loop switching section 25 controls the wavelength control performed by the wavelength controlling section 24 to an ON state, for example, in a state in which the aforesaid input light power is stable. Here, the aforesaid stability (whether the input light power is constant or not) can be determined, for example, by determining whether a value obtained by differentiating the monitor value of the input light power is within a constant range or not.

The calculating section 23 calculates a ratio of the monitor values obtained by the input PD 22*a* and PD 22 (i.e. PD1/PD2 where the monitor value of the PD22*a* is PD1 and the monitor value of the PD22 is PD2), and the wavelength controlling section 24 controls the passage characteristics of the VIPA optical system 21 so that the ratio (monitor ratio value) will fall within a constant range (a control target ratio value).

Figure 9A:
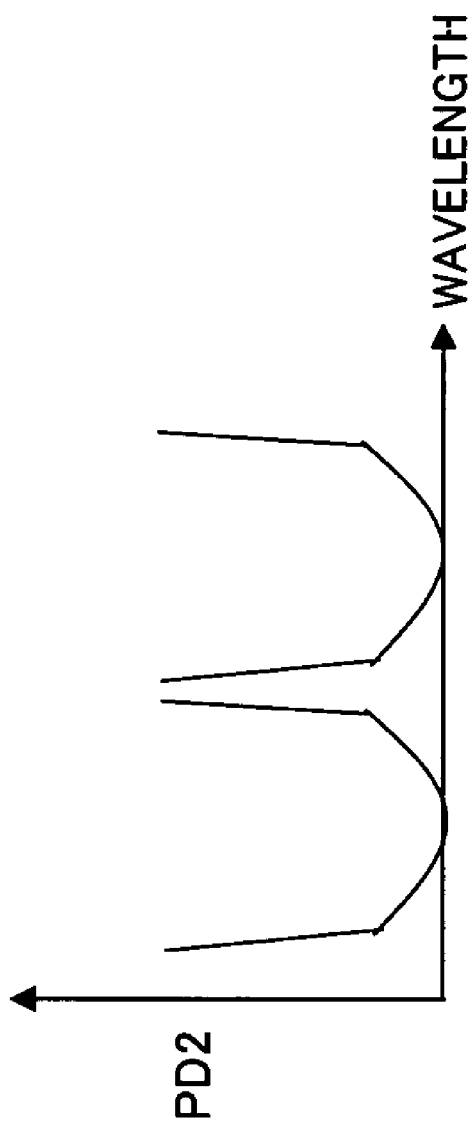
FIG. 9A is a view showing monitor characteristics of the leakage light (output light) on the high reflectivity side of the VIPA optical system shown in FIG. 8.
Figure 9B:
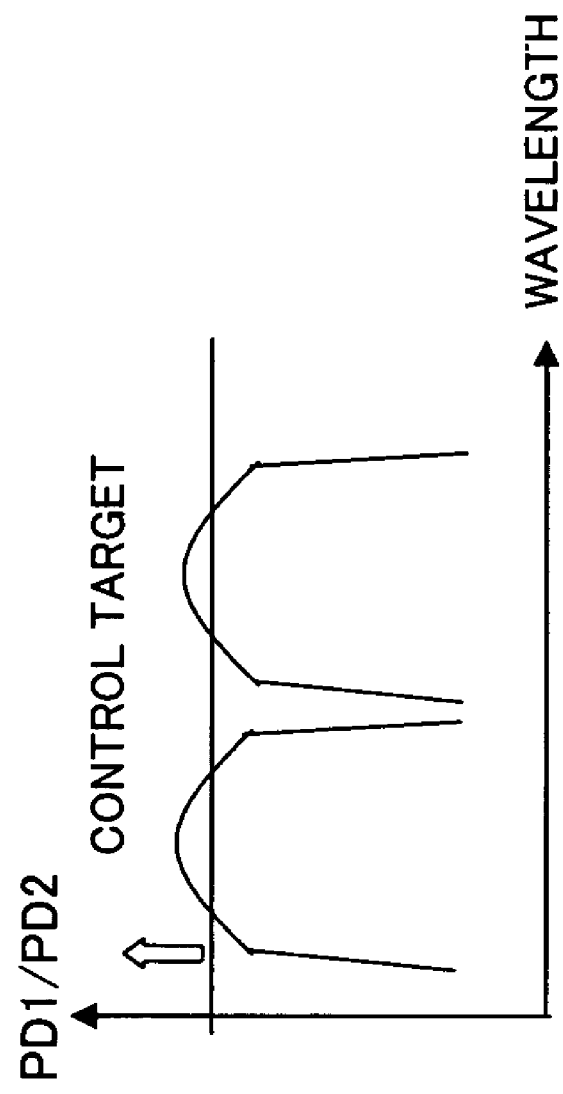
FIG. 9B is a view showing monitor characteristics of the input light to the VIPA optical system shown in FIG. 8.

Here, the monitor value of the PD 22 that monitors the leakage light from the higher reflectivity side of the VIPA plate 214 (input side reflecting surface 214*a*: See FIG. 2) has characteristics that have a valley (bottom) periodically to the wavelength as shown in FIG. 9A, for example. Since the monitor value PD1 obtained by the input PD 22*a* is constant in a state in which the input light power is stable, the aforesaid monitor ratio value (PD1/PD2) has periodic characteristics corresponding to the periodic passage characteristics (characteristics having a mount (peak) periodically to the wavelength) of the VIPA optical system 21 (VIPA plate 214) as shown by the model view of FIG. 9B, for example.

Therefore, in this case, the wavelength controlling section 24 controls the passage characteristics of the VIPA optical system 21 so that, for example, the aforesaid monitor ratio value will be at the peak or in the neighborhood thereof of a specific periodic characteristic as a control target ratio value. Here, the aforesaid control target ratio value is determined beforehand from the measured values or the like of the passage characteristics of the VIPA optical system 21 (VIPA plate 214) and stored into a memory or the like.

Hereafter, a wavelength controlling procedure of this embodiment constructed as shown above will be described.

When the wavelength λini of the input light from the optical transmitter 1 (light source) is shifted towards the shorter wavelength side from the center wavelength (peak) of a specific characteristic (See the solid line 54) among the periodic characteristics of the monitor ratio value (is within the wavelength range a) at the time of starting the device or the like as shown, for example, in FIG. 10A, the wavelength controlling section 24 controls to increase the aforesaid incidence angle a or decrease the equivalent optical length by changing the temperature so as to shift the passage characteristic 51 towards the shorter wavelength side as shown in FIG. 10B so that the aforesaid monitor ratio value will be a control target ratio value, whereby the input light wavelength λini and the center wavelength of the specific passage characteristic of the VIPA plate 214 are made equal to each other.

In this manner, by monitoring the light emitted from the two surfaces (higher reflectivity side and lower reflectivity side) of the VIPA plate 214 and the controlling VIPA optical system 21 by using the ratio thereof, the wavelength equalization can be carried out without the need for fine adjustment of the center wavelength of the VIPA optical system 21 for monitoring. Here, in FIG. 10, the monitor ratio value is expressed as "PD1/(PD2+C)", where this "C" represents a constant value (error difference or the like), and the same applies hereafter as well.

On the other hand, when the aforesaid input light wavelength λini is shifted towards the longer wavelength side from the center wavelength (peak) of a specific characteristic (See the broken line 55) among the periodic characteristics of the monitor ratio value (is within the wavelength range b) as shown, for example, in FIG. 11A, the wavelength controlling section 24 also in this case controls to increase the aforesaid incidence angle a or decrease the equivalent optical length by changing the temperature so as to shift the passage characteristic of the VIPA optical system 21 towards the shorter wavelength side as shown in FIG. 11B to shift the center wavelength of the passage characteristic (See the solid line 56), which is adjacent on the longer wavelength side, towards the shorter wavelength (input light wavelength λini) side, so that the monitor ratio value will be a control target value in relation to the passage characteristic 56, whereby the input light wavelength λini and the center wavelength of the passage characteristic of the VIPA optical system 21 are made equal to each other.

In other words, in this embodiment as well, when the input light wavelength λini is shifted towards the longer wavelength side from the center wavelength of the periodic passage characteristic of the aforesaid monitor ratio value that is dependent on the periodic passage characteristics of the VIPA optical system 21 (VIPA plate 214), the wavelength controlling section 24 shifts the passage characteristic of the VIPA plate 214 not towards the longer wavelength side (inverse direction) but in the same direction (towards the shorter wavelength side) as when the input light wavelength λini is shifted towards the shorter wavelength side, whereby the wavelength λini of the light source and the center wavelength of the passage characteristic of the VIPA optical system 21 are made equal to each other.

Therefore, in this case as well, the wavelength control is more simplified as compared with the case of performing a dithering operation by making specific passage characteristics to be shiftable both towards the longer wavelength side and the shorter wavelength side, thereby greatly contributing to the reduction of electric power consumption and circuit scale. Here, in this example, the shift towards the shorter wavelength side has been described; however, the shift towards the longer wavelength side may be implemented as well. Namely, when shifted either towards the shorter wavelength side or the longer wavelength side, shift in one direction may be implemented.

As described above, in this embodiment, since the ratio (monitor ratio value) of the input light power into the VIPA optical system 21 (VIPA plate 214) and the output light power on the higher reflectivity side of the VIPA plate 214 is measured and the passage characteristics of the VIPA plate 214 are controlled so that the monitor ratio value will be in a constant range (control target ratio value), advantages or effects similar to those in the first embodiment are obtained, and also the change in the passage characteristics can be grasped by separating it from the change in the output power (input light power) of the optical transmitter 1 (light source). Therefore, even if the output power of the light source changes to invite variation in the output light power of the VIPA plate 214, confusion with the variation in the wavelength can be prevented.

Therefore, the wavelength stabilization precision can be improved, and the danger of erroneous operation caused by the output wavelength not being an expected wavelength can be avoided. As a result of this, even if a change in the input light power to the VIPA optical system 21 inevitably occurs such as in starting the device, the wavelength control can be carried out even in the middle of the variation of the output light of the VIPA optical system 21 because the wavelength control is carried out on the basis of the input and output power ratio of the VIPA optical system 21. This eliminates the need for awaiting (stopping) the wavelength control until the output light power is stabilized, thereby reducing the time needed until the wavelength control (i.e. the time needed until the wavelength stabilization).

For example, FIGS. 13A to 13D shows a controlling procedure in the case where the wavelength control is carried out in the middle of the variation in the output light power at the time of starting the device (wavelength).

FIG. 13A shows change in the output light power (monitor value obtained by the PD 22) of the VIPA optical system 21; FIG. 13B shows change in the monitor values obtained by the PD 22a, 22; and FIG. 13C shows change in the monitor ratio value. As shown in these FIGS. 13A to 13C, it will be understood that the ratio of the monitor values obtained by the PD 22a, 22 does not change (remains constant) though the monitor value of the input PD 22a changes by variation in the output light power of the VIPA optical system 21.

Therefore, as shown in FIGS. 13C and 13D, the wavelength control by the wavelength controlling section 24 can be turned ON by the stability determining/loop switching section 25 even in the middle of the variation of the output light power of the VIPA optical system 21, there by reducing the time needed until the wavelength control.

Nevertheless, it is of course possible to perform wavelength control (sequence control) after withholding the wavelength control until the output light power becomes stable. FIGS. 12A to 12D shows a controlling procedure in the case of performing wavelength control by sequence control at the time of starting the device (wavelength). FIG. 12A shows change in the output light power (monitor value obtained by the PD 22) of the VIPA optical system 21; FIG. 12B shows change in the monitor values obtained by the PD 22a, 22; and FIG. 12C shows change in the monitor ratio value.

In the case of sequence control, the stability determining/loop switching section 25 turns the wavelength control performed by the wavelength controlling section 24 into an ON state after waiting for the output light power of the VIPA optical system 21 to become stable, as shown in FIGS. 12C and 12D.

[C] Description of the Third Embodiment

Figure 14:
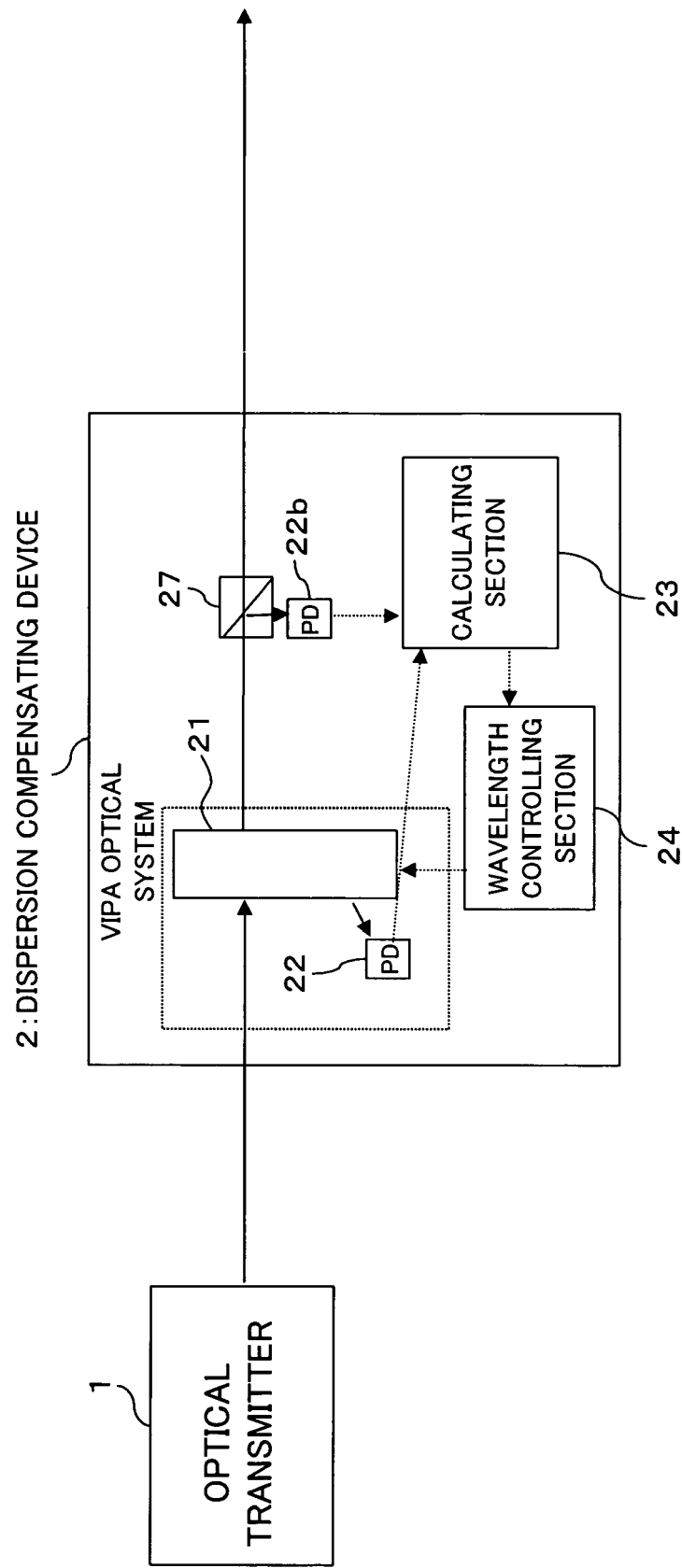
FIG. 14 is a block diagram showing a construction of a dispersion compensating system (optical transmission apparatus) to which a VIPA type dispersion compensator having a wavelength monitoring function according to the third embodiment of the present invention is applied.

FIG. 14 is a block diagram showing a construction of a dispersion compensating system (optical transmission apparatus) to which a VIPA type dispersion compensator having a wavelength monitoring function according to the third embodiment of the present invention. This system shown in FIG. 14 is different from the system described above with reference to FIG. 1 in that an optical coupler 27 and an output PD 22b are added on the output side of the VIPA optical system 21, and the output light power of the VIPA optical system 21 (light emitted from the surface having a lower reflectivity of the VIPA plate 214) is monitored by the output PD (lower reflectivity monitor means) 22b in the dispersion compensating device 2. Namely, the construction of this embodiment is such that the leakage light from the higher reflectivity side of the VIPA plate 214 (input side reflecting surface 214a: see FIG. 2) is monitored by the PD 22, and part of the light passing through the VIPA plate 214 is branched by the optical coupler 27 and monitored by the output PD 22b.

Figure 15:
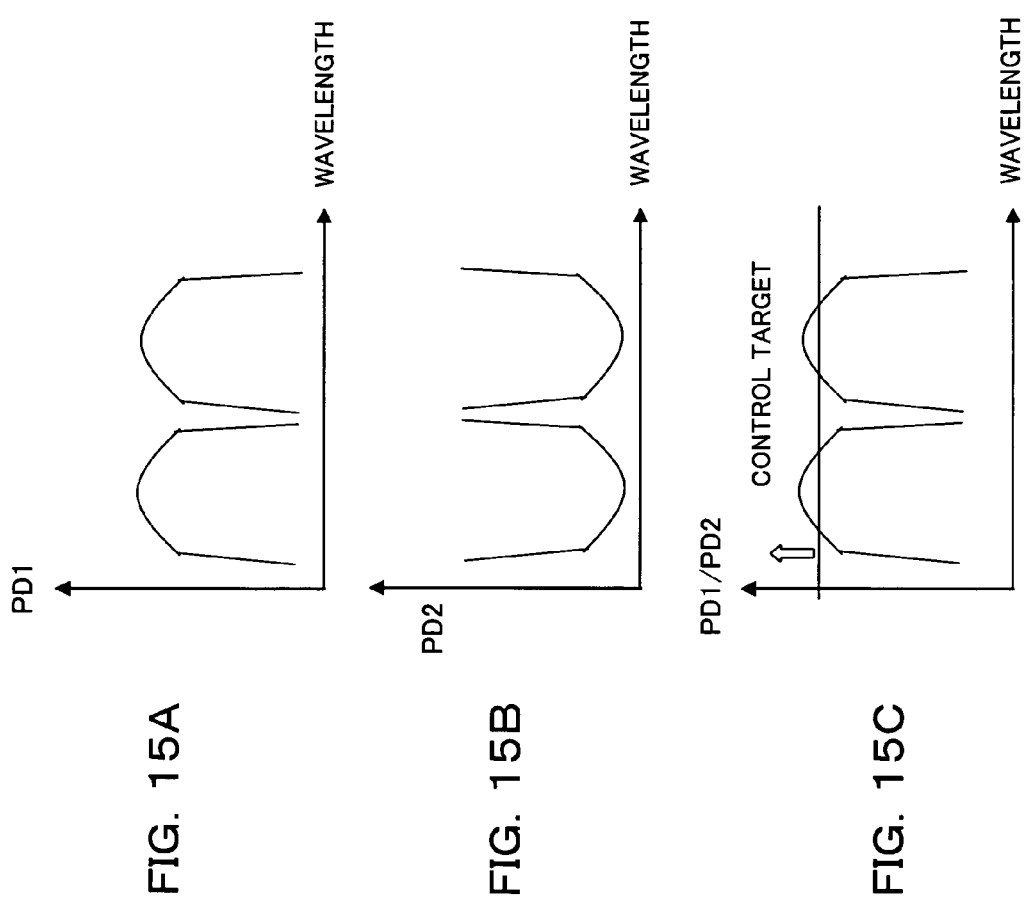
FIG. 15A is a view showing monitor characteristics of the output light of the VIPA optical system shown in FIG. 14.
FIG. 15B is a view showing monitor characteristics of the leakage light (output light) on the high reflectivity side of the VIPA optical system shown in FIG. 14.
FIG. 15C is a view showing characteristics of the ratio value of the input and output monitors of the VIPA optical system shown in FIG. 14 relative to the wavelength.

In this case, the monitor value obtained by the output PD 22b has periodic characteristics that are dependent on the periodic passage characteristics of the VIPA optical system 21 (VIPA plate 214), i.e. characteristics having a mount (peak) periodically to the wavelength, as shown by the model view of FIG. 15A, and the monitor value obtained by the PD 22 has characteristics generally inverse to this, i.e. characteristics having a valley (bottom) periodically to the wavelength, as shown by the model view of FIG. 15B.

Then, in this embodiment as well, the calculating section 23 determines the ratio of the monitor values obtained by the PD 22b, 22 (monitor ratio value=PD1/PD2), and the wavelength controlling section (controlling means) 24 controls the passage characteristics of the VIPA optical system 22 so that the monitor ratio value will be a predetermined control target ratio value (See FIG. 15C) in the same manner as in the second embodiment. Here, the detailed wavelength controlling procedure is similar to that described above with reference to FIGS. 10A, 10B, 11A, 11B, 12A to 12D, and 13A to 13D in the second embodiment.

In this manner, according to this embodiment, in the VIPA optical system 21, by allowing light to be leaked out also from the higher reflectivity side by letting the reflectivity of the higher reflection side of the VIPA plate 214 be less than 1 and monitoring and calculating the ratio of the light power of both the higher reflection side and the lower reflection side of the VIPA plate 214, characteristics that are not dependent on the input can be obtained, and also only one optical coupler (optical coupler 27) is needed, so that the loss on the main signal side can be restrained to the minimum.

In addition, in this example, sharper characteristics can be obtained as the aforesaid monitor ratio value as compared with the construction of the second embodiment (FIG. 8) in which the input light power (constant when stable) of the VIPA optical system 21 is monitored, so that an improvement in the sensitivity at the time of wavelength control can be expected.

[D] Description of the Fourth Embodiment

Figure 16:
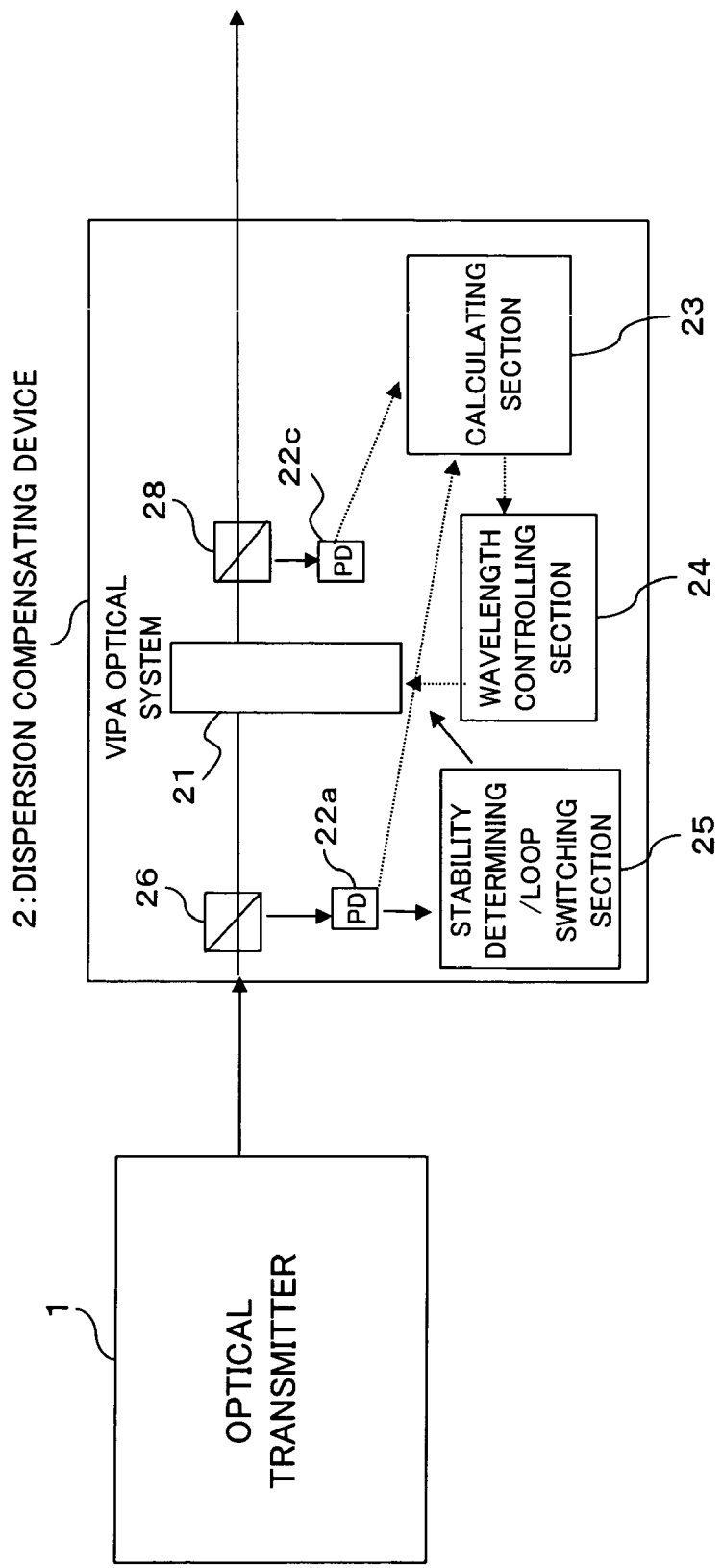
FIG. 16 is a block diagram showing a construction of a dispersion compensating system (optical transmission apparatus) to which a VIPA type dispersion compensator having a wavelength monitoring function according to the fourth embodiment of the present invention.

FIG. 16 is a block diagram showing a construction of a dispersion compensating system (optical transmission apparatus) to which a VIPA type dispersion compensator having a wavelength monitoring function according to the fourth embodiment of the present invention. This system shown in FIG. 16 is different from the system described above with reference to FIG. 8 in that an optical coupler 28 and an output PD 22c are provided on the output side of the VIPA optical system 21 instead of the PD 22 in the dispersion compensating device 22. Namely, the construction of this embodiment is such that the input and output light power of the VIPA optical system 21 is monitored by the PD 22a and the PD 22c.

In this case, the monitor value obtained by the output PD 22c has periodic characteristics that are dependent on the periodic passage characteristics of the VIPA optical system 21 (VIPA plate 214), i.e. characteristics having a mount (peak) periodically to wavelength, and the monitor value obtained by the input PD 22a has constant characteristics when being stable.

Figure 17:
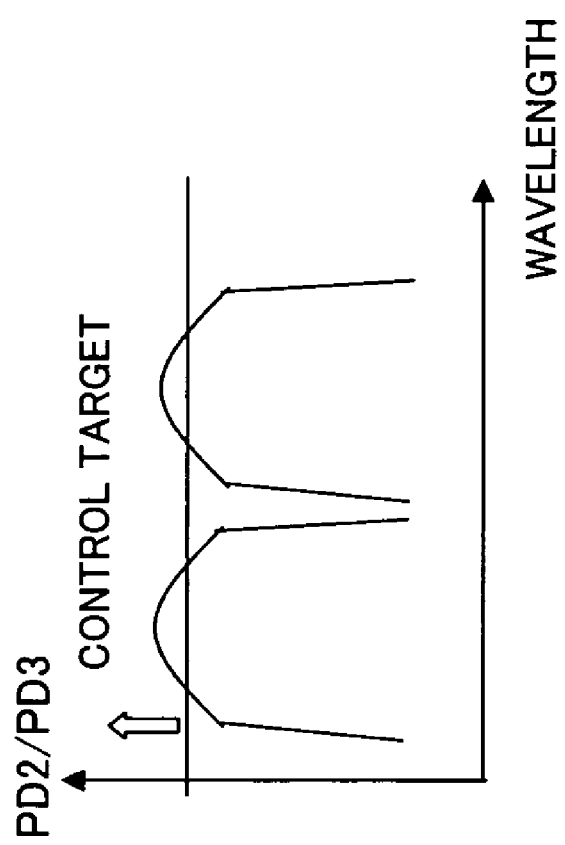
FIG. 17 is a view showing characteristics of the ratio value of the input and output monitors of the VIPA optical system shown in FIG. 16.

Then, in this embodiment as well, in the same manner as in the above-described second and third embodiments, the calculating section 23 calculates the ratio of the monitor values obtained by the PD 22a, 22c, i.e. monitor ratio value PD2/PD3 assuming the monitor value obtained by the PD 22a to be PD2 and the monitor value obtained by the PD 22c to be PD3, and the wavelength controlling section 24 controls the passage characteristics of the VIPA optical system 22 so that the monitor ratio value will be a predetermined control target ratio value (peak or neighborhood thereof of the periodic characteristic shown in FIG. 17). Here, in this embodiment as well, the detailed wavelength controlling procedure is similar to that described above with reference to FIGS. 10A, 10B, 11A, 11B, 12A to 12D, and 13A to 13D in the second embodiment.

Therefore, in this embodiment as well, functions and effects similar to those of the second embodiment can be obtained.

[E] Transmission System Construction Example

Figure 18A:
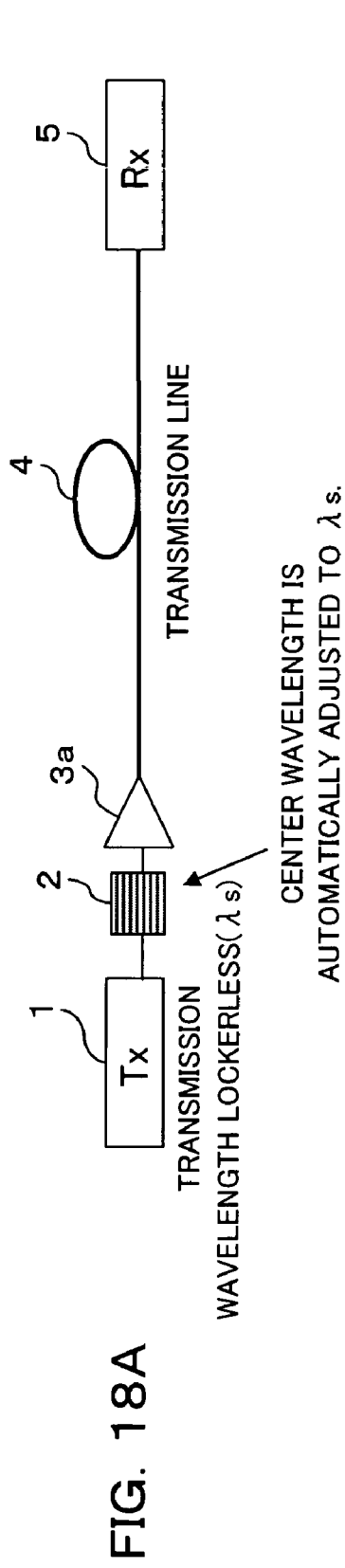
FIGS. 18A and 18B are views showing a construction of an optical transmission system to which the wavelength dispersion compensating device having a construction shown in FIG. 1, FIG. 7, FIG. 8, FIG. 14 or FIG. 16.
Figure 18B:
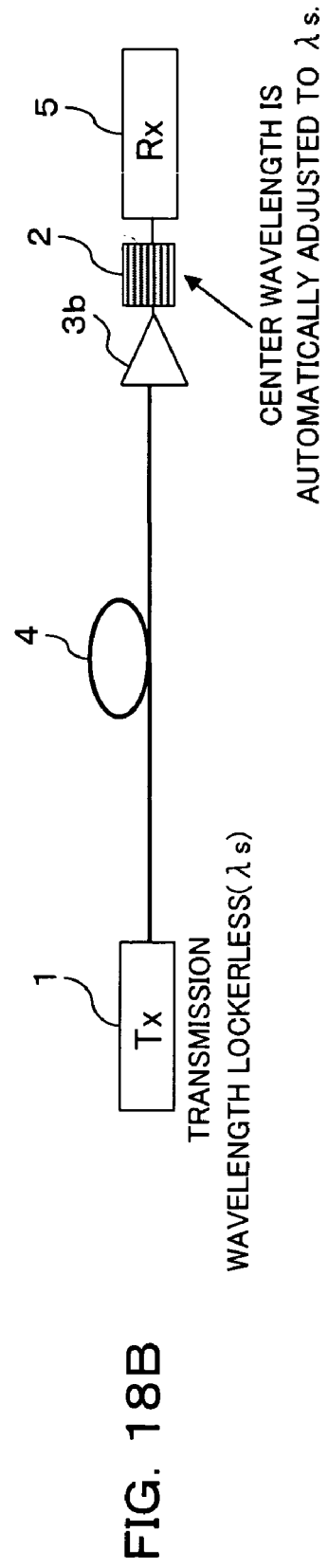
Figure 19:
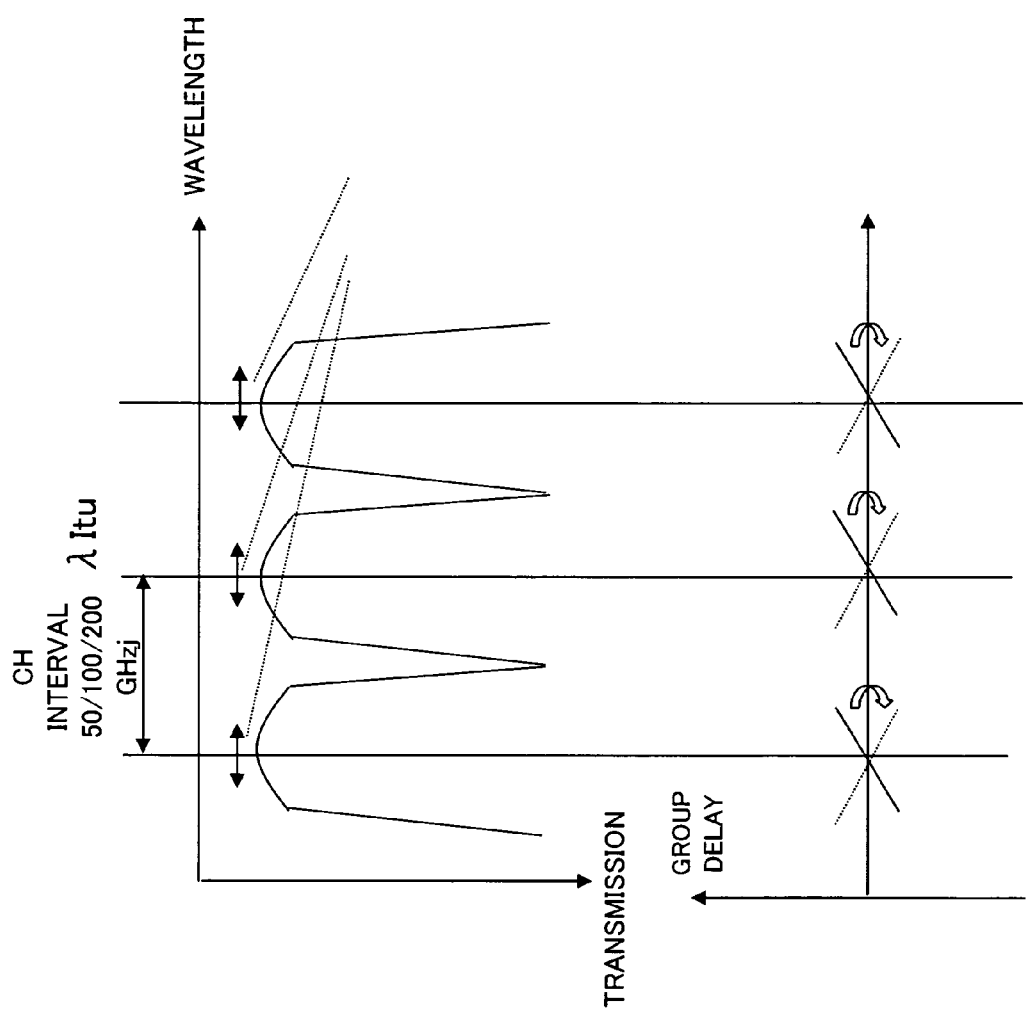
FIG. 19 is a model view showing one example of pass band characteristics and group delay characteristics of conventional VIPA relative to the wavelength.
Figure 20:
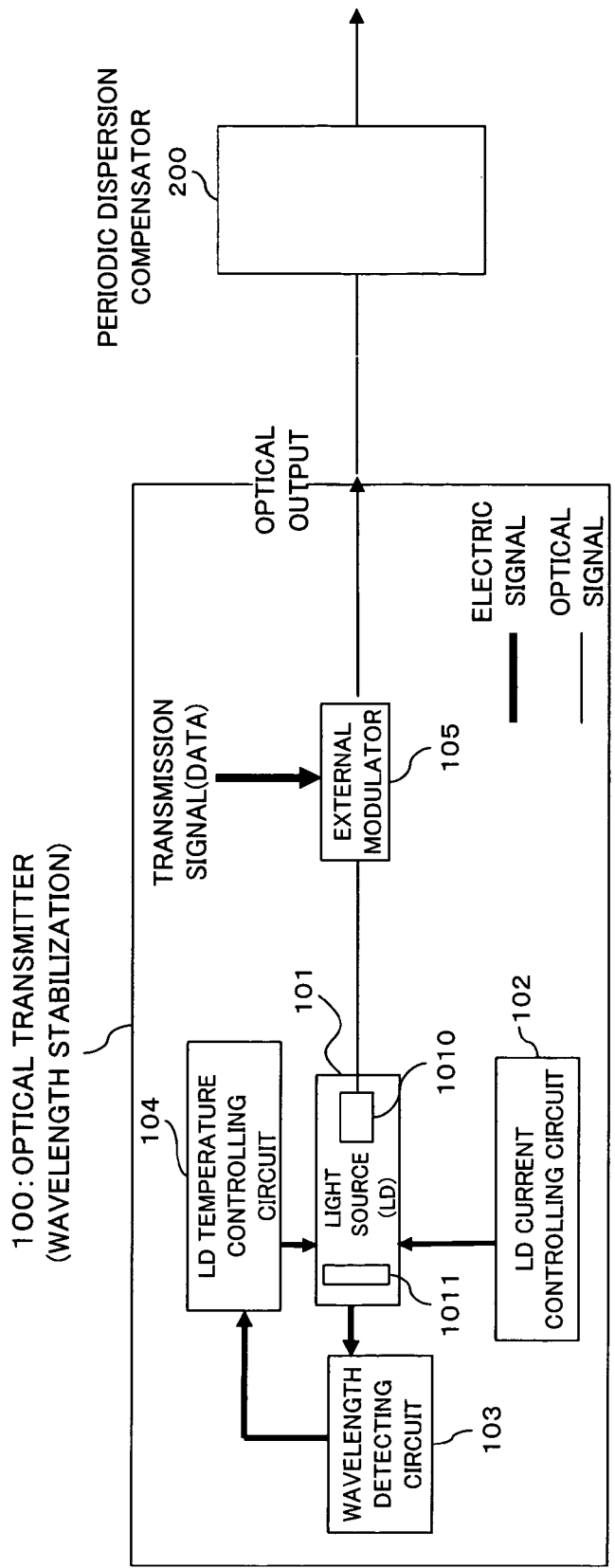
FIG. 20 is a block diagram for describing a conventional wavelength stabilizing technique.

The dispersion compensating device 2 of the above-described first to fourth embodiments may be provided on the transmitting side (between the optical transmitter 1 and optical amplifier 3a) as shown, for example, in FIG. 18A so that the center wavelength of the passage characteristics of the dispersion compensating device 2 (VIPA optical system 21) may be automatically equalized to the output wavelength λs of the optical transmitter 1, or may be provided on the receiving side (between optical amplifier 3b and optical receiver 5) as shown, for example, in FIG. 18B so that the center wavelength of the passage characteristics of the dispersion compensating device 2 (VIPA optical system 21) may be automatically equalized to the input wavelength λs that has passed through optical transmission line 4 and the optical amplifier 3b.

Here, it goes without saying that the present invention is not limited to the above-described embodiments and can be carried out by being modified in various ways within a scope that does not depart from the purport of the present invention.

What is claimed is:

1. A dispersion compensating device comprising:
   a virtually imaged phased array (VIPA) plate which is an optical component having two first and second reflecting surfaces that are opposite and parallel to each other, where light that has been converged in one-dimensional direction is incident between said two reflecting surfaces and, while the incident light is being multiply reflected at the two reflecting surfaces, a part of the light is transmitted through said second reflecting surface, and the transmitted light interferes to output substantially linearly dispersed light at an angle that is different depending on a wavelength;

a lens that converges the light of each wavelength that is output from said optical component;

a mirror having a reflecting surface that reflects the light converged by passing through said lens, where the reflecting surface has a shape capable of giving a constant wavelength dispersion to the light of each wavelength that is output from said optical component with respect to a direction substantially parallel to an angle dispersion direction at said optical component, and a shape capable of giving a different wavelength dispersion to the light of each wavelength that is output from said optical component with respect to a direction substantially perpendicular to the angle dispersion direction at said optical component; and high refractive index side monitor means for monitoring the light that is input into the VIPA plate and emitted from said first reflecting surface.

2. The dispersion compensating device of claim 1, further comprising low refractive index side monitor means for monitoring the light that is emitted from said second reflecting surface.

3. The dispersion compensating device of claim 2, further comprising controlling means for controlling passage characteristics of the VIPA plate so that a monitor ratio value which is a ratio of monitor results obtained by said high refractive index side monitor means and said low refractive index side monitor means may fall within a constant range.

4. The dispersion compensating device of claim 3, wherein the controlling means controls the passage characteristics of the VIPA plate towards only one of shorter wavelength side and longer wavelength side so that the monitor ratio value may fall within the constant range.

5. The dispersion compensating device of claim 4, wherein a reflectivity of said first reflecting surface is set to be less than 1.

6. The dispersion compensating device of claim 3, wherein a reflectivity of said first reflecting surface is set to be less than 1.

7. The dispersion compensating device of claim 2, wherein a reflectivity of said first reflecting surface is set to be less than 1.

8. The dispersion compensating device of claim 1, further comprising input light monitor means for monitoring light prior to input into the VIPA plate.

9. The dispersion compensating device of claim 8, further comprising controlling means for controlling passage characteristics of the VIPA plate so that a monitor ratio value which is a ratio of monitor results obtained by said high refractive index side monitor means and said input light monitor means may fall within a constant range.

10. The dispersion compensating device of claim 9, wherein said controlling means controls the passage characteristics of the VIPA plate towards only one of shorter wavelength side and longer wavelength side so that the monitor ratio value may fall within the constant range.

11. The dispersion compensating device of claim 10, wherein a reflectivity of said first reflecting surface is set to be less than 1.

12. The dispersion compensating device of claim 9, wherein a reflectivity of said first reflecting surface is set to be less than 1.

13. The dispersion compensating device of claim 8, wherein a reflectivity of said first reflecting surface is set to be less than 1.

14. The dispersion compensating device of claim 1, further comprising controlling means for controlling passage characteristics of the VIPA plate to wavelength so that a monitor result obtained by said high refractive index side monitor means may become a predetermined value.

15. The dispersion compensating device of claim 14, wherein said controlling means controls the passage characteristics of the VIPA plate towards only one of shorter wavelength side and longer wavelength side so that the monitor result may become the predetermined value.

16. The dispersion compensating device of claim 14, wherein a reflectivity of said first reflecting surface is set to be less than 1.

17. The dispersion compensating device of claim 14, wherein a reflectivity of said first reflecting surface is set to be less than 1.

18. The dispersion compensating device of claim 1, wherein a reflectivity of said first reflecting surface is set to be less than 1.

19. An optical transmission system comprising:

an optical transmitter that transmits light of predetermined wavelength, and a dispersion compensating device that compensates wavelength dispersion of the light transmitted from said optical transmitter, said dispersion compensating device comprising:

a virtually imaged phased array (VIPA) plate which is an optical component having first and second reflecting surfaces that are opposite and parallel to each other, where light that has been converged in one-dimensional direction is incident between said two reflecting surfaces and, while the incident light is being multiply reflected at the two reflecting surfaces, a part of the light is transmitted through said second reflecting surface, and the transmitted light interferes to output substantially linearly dispersed light at an angle that is different depending on a wavelength;

a lens that converges the light of each wavelength that is output from said optical component;

a mirror having a reflecting surface that reflects the light converged by passing through said lens, where the reflecting surface has a shape capable of giving a constant wavelength dispersion to the light of each wavelength that is output from said optical component with respect to a direction substantially parallel to an angle dispersion direction at said optical component, and a shape capable of giving a different wavelength dispersion to the light of each wavelength that is output from said optical component with respect to a direction substantially perpendicular to the angle dispersion direction at said optical component; and said optical transmission system further comprising monitor means for monitoring the light that is input into said optical component and emitted from said first reflecting surface.

* * * * *

UNITED STATES PATENT AND TRADEMARK OFFICE
CERTIFICATE OF CORRECTION

| | | |
|---|---|---|
| PATENT NO. | : 7,366,422 B2 | Page 1 of 1 |
| APPLICATION NO. | : 11/085419 | |
| DATED | : April 29, 2008 | |
| INVENTOR(S) | : Motoyoshi Sekiya et al. | |

It is certified that error appears in the above-identified patent and that said Letters Patent is hereby corrected as shown below:

Col. 17, line 45, claim 6 delete "where";
       line 46, delete "in" and insert --wherein--, therefor.

Col. 18, line 4, claim 13 delete "where"
       line 5, delete "in" and insert --wherein--, therefor.

Signed and Sealed this

Twenty-sixth Day of August, 2008

JON W. DUDAS
*Director of the United States Patent and Trademark Office*